US008521112B2

(12) United States Patent  
Kitsunezuka et al.

(10) Patent No.: US 8,521,112 B2  
(45) Date of Patent: Aug. 27, 2013

(54) QUADRATURE MIXER

(75) Inventors: Masaki Kitsunezuka, Tokyo (JP); Takashi Tokairin, Tokyo (JP)

(73) Assignee: NEC Corporation, Tokyo (JP)

( * ) Notice: Subject to any disclaimer, the term of this patent is extended or adjusted under 35 U.S.C. 154(b) by 52 days.

(21) Appl. No.: 13/382,143

(22) PCT Filed: Jun. 23, 2010

(86) PCT No.: PCT/JP2010/061087  
§ 371 (c)(1),  
(2), (4) Date: Jan. 3, 2012

(87) PCT Pub. No.: WO2011/004737  
PCT Pub. Date: Jan. 13, 2011

(65) Prior Publication Data  
US 2012/0098585 A1   Apr. 26, 2012

(30) Foreign Application Priority Data

Jul. 4, 2009 (JP) ................................ 2009-159377

(51) Int. Cl.  
*H04B 1/16* (2006.01)

(52) U.S. Cl.  
USPC ........................... 455/216; 455/313; 455/323

(58) Field of Classification Search  
USPC .................. 455/189.1, 190.1, 209, 293, 216, 455/313, 323; 327/355, 356, 359; 329/306; 375/261, 298  
See application file for complete search history.

(56) References Cited

U.S. PATENT DOCUMENTS

| | | | | |
|---|---|---|---|---|
| 6,294,952 | B1 * | 9/2001 | Kato .............................. | 329/306 |
| 7,418,250 | B2 * | 8/2008 | Igarashi et al. ............... | 455/313 |
| 7,506,016 | B2 * | 3/2009 | Kasperkovitz ................ | 708/620 |
| 7,609,776 | B2 * | 10/2009 | Ali et al. ........................ | 375/261 |
| 7,653,372 | B2 * | 1/2010 | Yang et al. .................... | 455/313 |
| 7,769,361 | B2 * | 8/2010 | Zhuo et al. .................... | 455/324 |
| 7,826,816 | B2 * | 11/2010 | Zhuo et al. .................... | 455/315 |
| 2003/0071674 | A1 | 4/2003 | Kano | |
| 2006/0088136 | A1 | 4/2006 | Morie et al. | |
| 2007/0112904 | A1 | 5/2007 | Kasperkovitz | |
| 2009/0138744 | A1 | 5/2009 | Kasperkovitz | |

FOREIGN PATENT DOCUMENTS

| | | | |
|---|---|---|---|
| JP | 2003-060441 A | 2/2003 | |
| JP | 2006-157866 A | 6/2006 | |
| JP | 2007-535830 A | 12/2007 | |
| JP | 2009-060174 A | 3/2009 | |

* cited by examiner

*Primary Examiner* — Sonny Trinh  
(74) *Attorney, Agent, or Firm* — McGinn IP Law Group, PLLC

(57) ABSTRACT

This invention provides an quadrature mixer which does not require a long time to adjust the amplitude value at the time of demodulation of the IQ signal. The quadrature mixer, comprising a first frequency-conversion unit that outputs a sixth signal derived by multiplying a first signal by a second and a fourth signals, a second frequency-conversion unit that outputs a seventh signal derived by multiplying the first signal by a third and a fifth signals, a first amplitude adjustment unit that outputs a eighth signal derived by multiplying the sixth signal by the third and fifth signals and a second amplitude adjustment unit that outputs a ninth signal derived by multiplying the seventh signal by the second and fifth signals.

20 Claims, 19 Drawing Sheets

1/4 PERIOD
(DUTY RATIO 0.25)

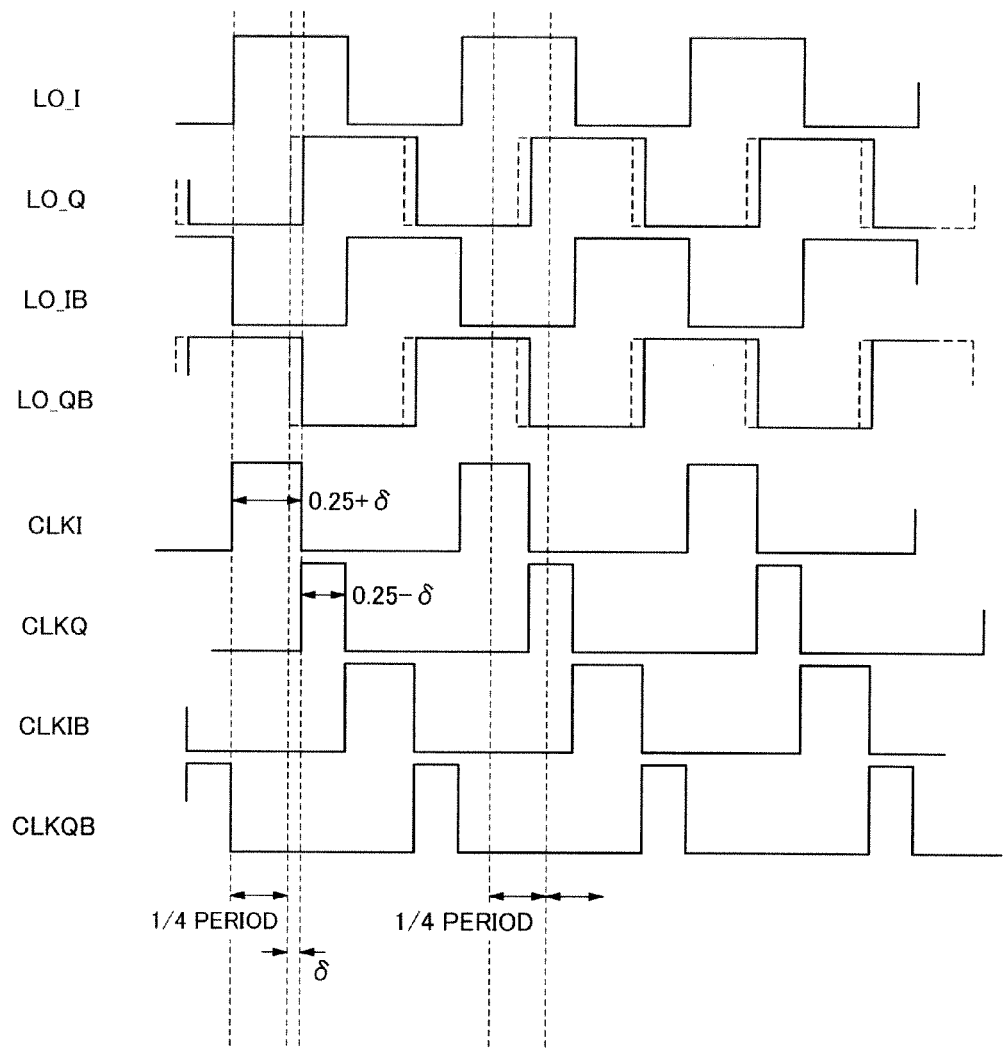

QUADRATURE MIXER

TECHNICAL FIELD

The invention relates to a mixer which multiplies two signals to acquire demodulated signals each having a different frequency, in particular an quadrature mixer which acquires mutually-orthogonal demodulated signals.

BACKGROUND ART

In these days, a modulation system used in a wireless communication system employs two baseband signals, which are at right angles to each other, at the time of transmission and reception in order to enhance frequency usage efficiency. The two signals are called an I signal and a Q signal. The I signal and the Q signal are modulated at the time of transmission and are demodulated at the time of reception. At this time, an quadrature mixer is required, which correctly demodulates 90-degree phase difference between the I signal and the Q signal, on a receiving side.

FIG. 9 illustrates an quadrature mixer described in Patent document 1. FIG. 2A is a diagram illustrating an operational waveform of a Local Oscillator (LO) signal thereof. The mixer employs clock signals (CLKI, CLKQ, CLKIB, CLKQB) each having a duty ratio of 25%, phases of which are shifted by 90 degrees each other, instead of LO (LO_I, LO_Q) signals with a duty ratio of 50%, phases of which are shifted by 90 degrees each other. As a result, a circuit (transistor) which converts a voltage signal in a received Radio Frequency (RF) band into a current is shared on the I side and the Q side. That is because it is necessary to avoid the problem that an error occurs in amplitude of both of the modulated I signal and the modulated Q signal if each conversion gain is fluctuated, when a voltage-current conversion circuit is separately arranged at both of the I side and the Q side.

As shown in FIG. 2B, even when the phase difference between LO_I and LO_Q deviates from 90 degrees, phase relations of four-phase clocks generated thereby is characterized in correctly differing by 90 degrees each other. Therefore, an IQ signals being correctly at right angle each other can be demodulated.

Patent document 2 describes a configuration of a wireless circuit with a mode which adjusts amplitude errors of the I signal and the Q signal, as shown in FIG. 21. In the configuration, in an idle slot, an output signal of an orthogonal modulator directly enters an orthogonal demodulator as a test signal. A technology is disclosed, in which an adjustment value is updated so that amplitude of the I signal and that of the Q signal are equalized.

BACKGROUND ART DOCUMENT

Patent Document

Patent document 1: TOKUKAI 2003-060441 A
Patent document 2: TOKUKAI 2009-060174 A

SUMMARY OF THE INVENTION

Problems to be Solved by the Invention

In the quadrature mixer, the amplitude error which occurs between demodulated IQ signals requires to be adjusted, when the phase difference between LO_I and LO_Q deviates from 90 degrees. In the quadrature mixer disclosed in Patent documents 1 and 2, there is the problem in which a long time is required to adjust the amplitude error In the quadrature mixer described in Patent document 1, the amplitude error between IQ is adjusted by changing a value of a resistance which is a load. The resistance has to have the function of variability for adjustment in advance. It requires a long time to determine an adjustment value, since it is necessary to integrate the amount of the error for a long time and detect the small amplitude error.

In the technology of Patent document 2, means for directly inputting the output signal of the orthogonal modulator into the orthogonal demodulator as the test signal, and for updating the adjustment value to make the amplitude of the I signal and that of the Q signal equal is required.

An object of the invention is to provide an quadrature mixer which does not require a long time to adjust the amplitude value at the time of demodulation of the IQ signal.

Means for Solving the Program

An quadrature mixer of the invention is characterized in comprising a first frequency-conversion unit which outputs a sixth signal derived by receiving and multiplying a first signal by a second signal and a fourth signal, a second frequency-conversion unit which outputs a seventh signal derived by receiving and multiplying a first signal by a third signal and a fifth signal, a first amplitude adjustment unit which receives the sixth signal with the third signal and fifth signal and outputs a eighth signal, and a second amplitude adjustment unit which receives the seventh signal with the second signal and fifth signal and outputs a ninth signal.

Effect of the Invention

The quadrature mixer of the invention is capable of demodulating an IQ signal without requiring a long time to adjust an amplitude value.

BRIEF DESCRIPTION OF THE DRAWINGS

FIG. 2B is a diagram illustrating timing of a clock signal required for an operation of the first embodiment of the invention.

MODE FOR EXECUTING THE INVENTION

[First Embodiment]

Figure 1:
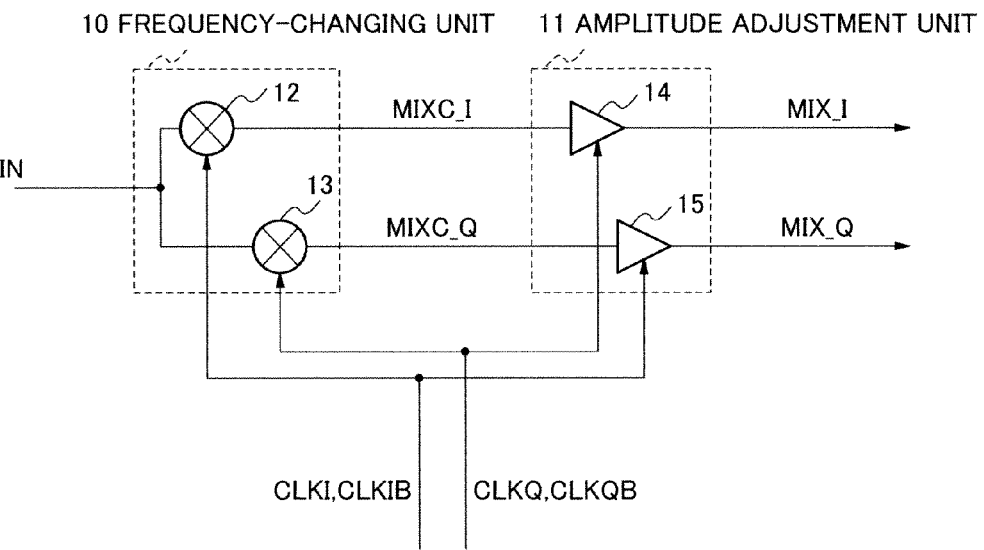
FIG. 1 is a diagram illustrating a first embodiment of the invention.

Next, the embodiment is described in detail with reference to drawings. Regarding all the drawings described below, the same component is given the same reference numeral, and descriptions thereof are optionally omitted.

[Description on configuration] FIG. 1 is a diagram illustrating an quadrature mixer of a first embodiment of the embodiment.

Figure 2A:
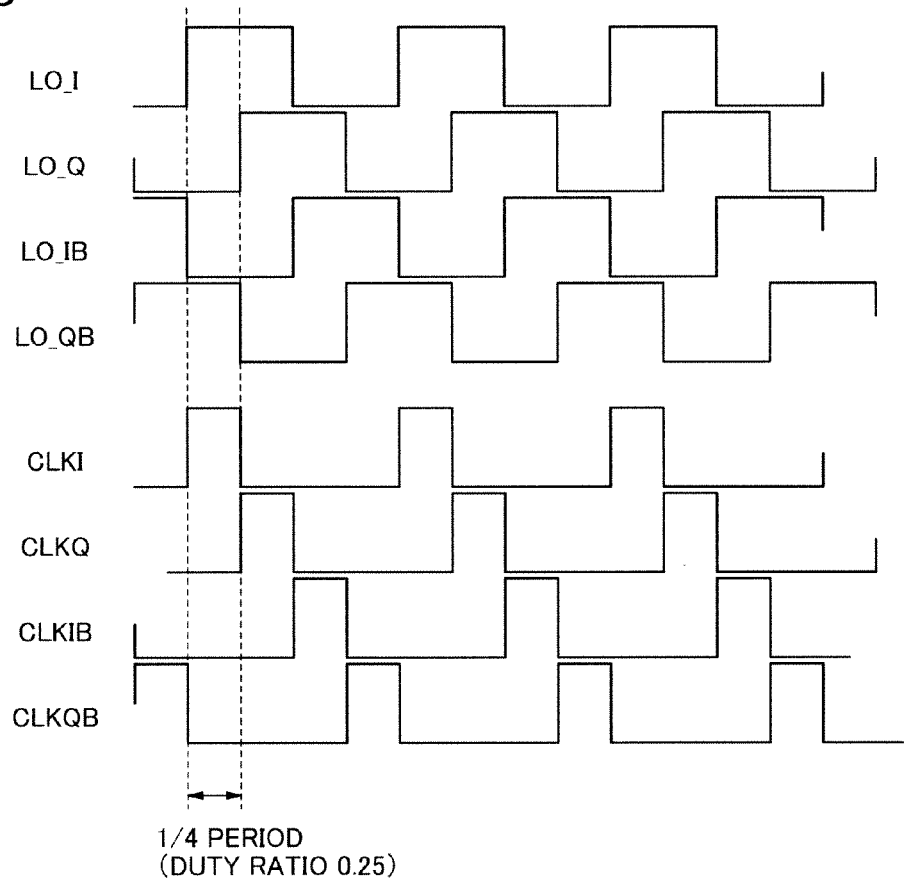
FIG. 2A is a diagram illustrating timing of a clock signal required for an operation of the first embodiment of the invention.

FIG. 2A is a diagram of an operational waveform of a clock signal related to the quadrature mixer of the embodiment. The quadrature mixer of the embodiment is composed of a frequency-conversion unit 10 and an amplitude adjustment unit 11.

A high-frequency signal with more than several hundred MHz includes a problem that it requires complicated circuit design and high product cost to modulate and demodulate data. Therefore, the frequency-conversion unit 10 includes a function to decrease a frequency by inputting a clock signal into a receiving signal (RF signal) in order to conduct demodulation.

As shown in FIG. 1, the frequency-conversion unit 10 includes an I-side frequency-conversion unit 12 conducting signal processing on the I side and a Q-side frequency-conversion unit 13 conducting signal processing on the Q side. Receiving the RF signal (receiving signal) and clock signals CLKI, CLKIB shown in FIG. 2A, the I-side frequency-conversion unit 12 outputs, by multiplying both of them, a signal of baseband with a frequency lower than that of the RF signal or a signal with a second intermediate frequency, as a MIXC_I.

Receiving the RF signal (receiving signal) and CLKQ, CLKQB, the Q-side frequency-conversion unit 13 similarly outputs, by multiplying both of them, a signal of the baseband with a frequency lower than that of the RF signal or a signal with a second intermediate frequency, as a MIXC_Q.

The amplitude adjustment unit 11 includes an I-side amplitude adjustment unit 14 bearing signal processing on the I side and a Q-side amplitude adjustment unit 15 bearing signal processing on the Q side. The I-side amplitude adjustment unit 14 connects with the I-side frequency-conversion unit 12. On reception of MIXC_I, and CLKQ and CLKQB, the I-side amplitude adjustment unit 14 outputs, by multiplying both of them, a signal in the baseband with a frequency lower than that of the RF signal or a signal in the intermediate frequency band, as a MIX_I. Similarly, the Q-side amplitude adjustment unit 15 connects with the Q-side frequency-conversion unit 13. Receiving MIXC_Q, and CLKI and CLKIB, the Q-side amplitude adjustment unit 15 outputs, by multiplying both of them, a baseband with a frequency lower than that of the RF signal or a signal in the intermediate frequency band, as a MIX_Q.

The RF signal corresponds to a first signal, the CLKI, CLKQ, CLKIB and CLKQB correspond to a second, a third, a fourth and a fifth signals, the MIXC I and MIXC_Q correspond to a sixth and a seventh signals, and the MIX_I and MIXQ correspond to a eighth and a ninth signals, respectively.

[Description on action and operation] Operations are described below with reference to a configuration example of each part.

Figure 3:
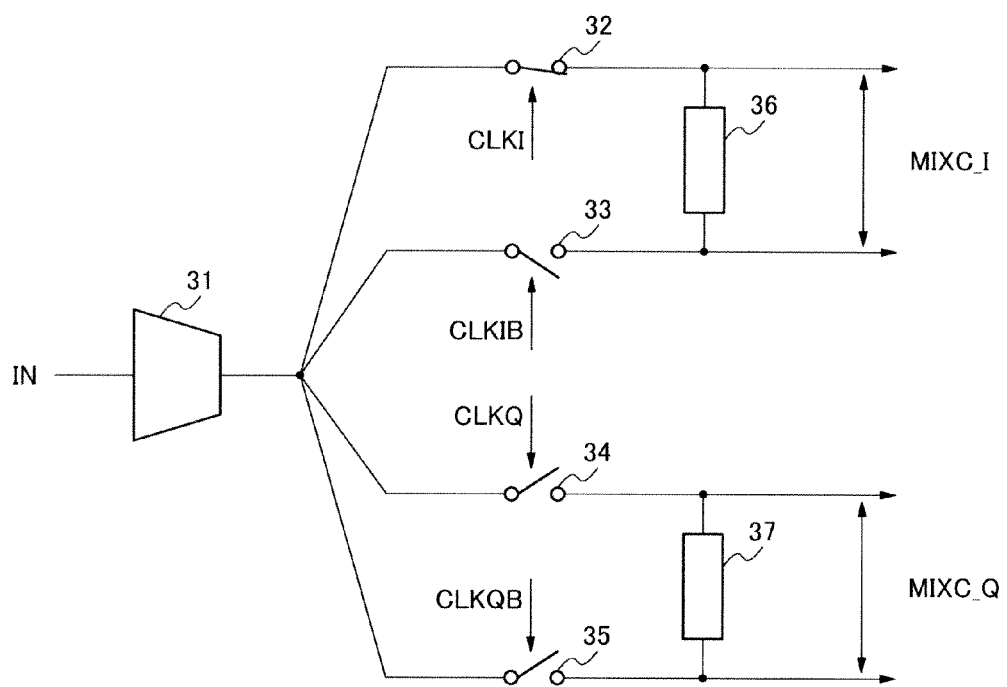
FIG. 3 is a diagram illustrating a frequency-conversion unit used in the first embodiment of the invention.

FIG. 3 shows a configuration example of the frequency-conversion unit 10. The frequency-conversion unit 10 includes a voltage-to-current changing circuit 31 changing a voltage signal of a RF band into a current, switching elements 32, 33, 34 and 35 selecting a path to output the current, and loads 36 and 37 changing the current into a voltage. The switching element 32 and the switching element 33 connect to each of both ends of the load 36, respectively. A signal which appears at the both ends of the load 36 is the MIXC_I. The switching element 34 and the switching element 35 connect to each of both ends of the load 37, respectively. A signal which appears at the both ends of the load 37 is the MIXC_Q.

An operation of the frequency-conversion unit 10 of the embodiment is described below. The voltage signal inputted into the frequency-conversion unit 10 is changed into a current with the voltage-to-current changing circuit 31. Since the voltage-to-current changing circuit 31 is shared at the I side and the Q side, dispersion of a transistor does not appear as an error between IQ.

The embodiment shows the case that an ideal LO signal is acquired, and by conducting a logical product operation thereof, clock signals CLKI, CLKQ, CLKIB and CLKQB each having a duty ratio of 25%, phases of which shift by 90 degrees each other. The embodiment describes the case in which a clock signal is used. However, the embodiment is not limited thereto, and may employ the LO signal.

An output current of the voltage-to-current changing circuit 31 flows to a positive phase output terminal, if the switching element 32 is closed while the CLKI remains at a high level. The output current of the voltage-to-current changing circuit 31 flows to a negative phase output terminal, if the switching element 33 is closed while the CLKIB remains at a high level.

The output current of the voltage-to-current changing circuit 31 flows to the positive phase output terminal on the Q side while the CLKQ remains at a high level, and flows to the negative phase output terminal on the Q side while the CLKQB remains at a high level.

As descriptions above, when the RF signal (receiving signal) is changed into a current with the voltage-to-current changing circuit 31, and the clock signal enters each of terminals, multiplication of the RF signal and the clock signal is conducted and frequency conversion to reduce a frequency is conducted.

The case is described, in which CLKI, CLKQ, CLKIB and CLKQB each having no shift in phase difference and ideal 25% are acquired, as shown in FIG. 2A. Since a current is allocated to each of terminals for the same period of time and is changed into a voltage again, an amplitude of the output MIXC_I on the I side and an amplitude of the output MIXC_Q on the Q side become equal to each other.

Next, an operation of the case is considered, in which phase difference between LO_I and LO_Q deviates from 90 degrees by ($\delta \times 360$) degrees due to temperature change, change of a power source voltage or the like, as shown FIG. 2B. In the above case, generated duty ratios of CLKI (or CLKIB) and CLKQ (or CLKQB) are ($\frac{1}{4}+\delta$) and ($\frac{1}{4}-\delta$), respectively.

Therefore, regarding CLKI, a current is allocated to the positive phase output terminal on the I side at a time ratio of ($\frac{1}{4}+\delta$). Regarding CLKQ, a current is allocated to the positive phase output terminal on the Q side at a time ratio of ($\frac{1}{4}-\delta$). Regarding CLKIB, a current is allocated to the negative phase output terminal on the IB side at a time ratio of ($\frac{1}{4}+\delta$). Regarding CLKQB, a current is allocated to the negative phase output terminal on the QB side at a time ratio of ($\frac{1}{4}-\delta$).

A ratio of amplitude of the output MIXC_I on the I side of the frequency-conversion unit and amplitude of the output MIXC_Q on the Q side thereof is approximately represented in the following formula.

$$\left|\frac{MIXIC_I}{MIXIC_Q}\right| = \frac{\sin\left(\pi\left(\frac{1}{4}+\delta\right)\right)}{\sin\left(\pi\left(\frac{1}{4}-\delta\right)\right)} \approx \frac{1+\pi\delta}{1-\pi\delta} \quad (1)$$

The above approximation holds when $\delta$ is sufficiently small. Since each of phase differences between CLKI and CLKQ, CLKQ and CLKIB, CLKIB and CLKQB, and CLKQB and CLKI keeps 90 degrees regardless of $\delta$, phase difference between the output MIXC_I on the I side and the output MIXC_Q on the Q side does not deviate from 90 degrees.

Figure 4:
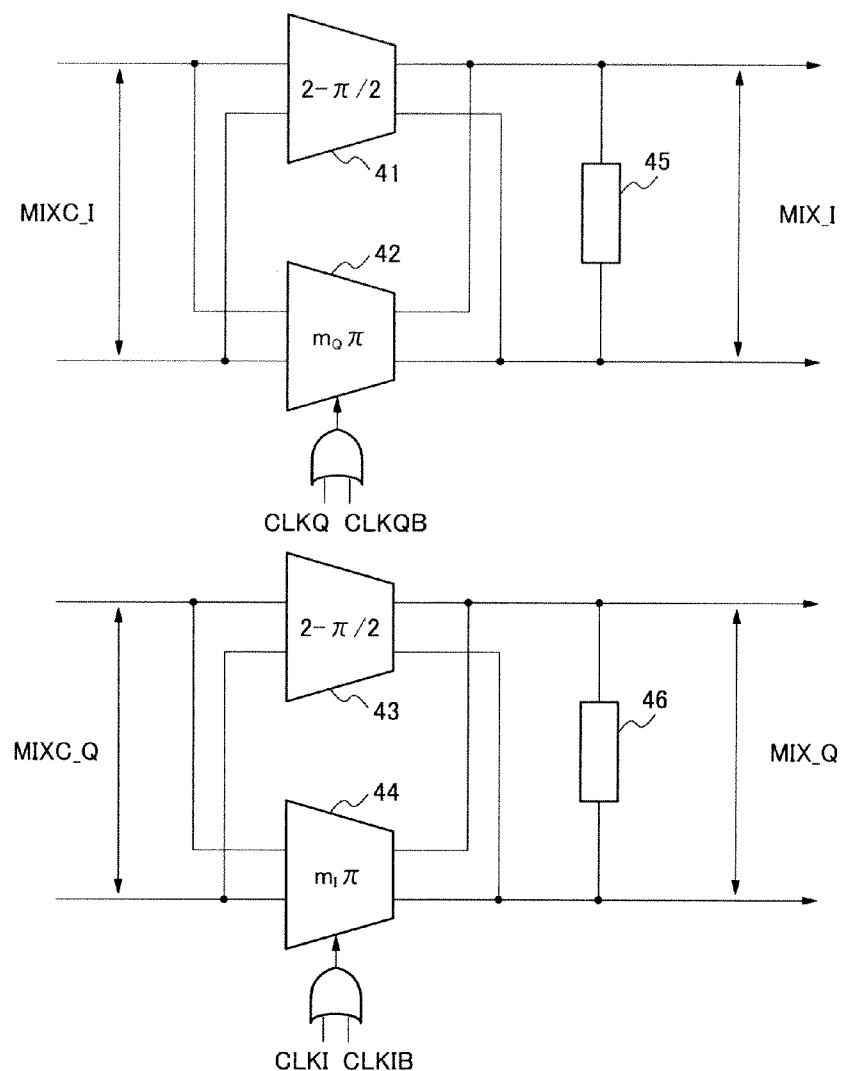
FIG. 4 is a diagram illustrating an amplitude adjustment unit used in the first embodiment of the invention.

FIG. 4 illustrates a configuration example of the amplitude adjustment 11 of the embodiment. The amplitude adjustment 11 is composed of voltage-to-current changing units 41, 42, 43 and 44 and loads 45 and 46 changing a current into a voltage again.

Each of conversion gain of the voltage-to-current changing units 41 and 43 is ($2-\pi/2$). Each of the voltage-to-current changing units 42 and 44 having a control terminal includes a conversion gain proportional to a duty ratio d of a control clock signal which enters the control terminal.

A result of the OR operation of CLKQ and CLKQB is given to the control terminal of the voltage-to-current changing units 42. A result of the OR operation of CLKI and CLKIB is given to the control terminal of the voltage-to-current changing units 44. The voltage-to-current changing unit 42 receives a control clock signal with a duty ratio of dQ. The voltage-to-current changing unit 44 receives a control clock signal with a duty ratio of dI.

If a duty ratio of the control clock signal inputted to the voltage-to-current changing unit 42 is dQ, a ratio of a conversion gain of the voltage-to-current changing unit 41 and that of the voltage-to-current changing unit 42 becomes ($2-\pi/2$): $\pi$ dQ. If a duty ratio of the control clock signal inputted to the voltage-to-current changing unit 44 is dI, a ratio of a conversion gain of the voltage-to-current changing unit 43 and that of the voltage-to-current changing unit 44 becomes ($2-\pi/2$): $\pi$ dI.

An operation of the amplitude adjustment unit 11 of the embodiment is described below. Initially, the case is explained, to in which CLKI, CLKQ, CLKIB and CLKQB each having no shift in phase difference and ideal 25% are acquired, as shown in FIG. 2A. At this time, since dQ=dI=$\frac{1}{2}$, the total conversion gain GmI of the voltage-to-current changing unit 41 on the I side and the voltage-to-current changing unit 42 thereon becomes ($2-\pi/2$)+$\pi \times \frac{1}{2}$=1. Further, the total conversion gain GmQ of the voltage-to-current changing units 43 and 44 on the Q side becomes ($2-\pi/2$) + $\pi \times \frac{1}{2}$=1, and a ratio of GmI and GmQ becomes 1.

Next, the case is considered, in which phase difference between LO_I and LO_Q deviates from 90 degrees by ($\delta \times 360$) degrees due to temperature change, change of a power source voltage or the like, as shown FIG. 2B. The duty ratio of CLKI (or CLKIB) generated at the time becomes ($\frac{1}{4}+\delta$), and dQ becomes $2\times(\frac{1}{4}+\delta)$=($\frac{1}{2}+2\delta$). The duty ratio of CLKQ (or CLKQB) becomes ($\frac{1}{4}-\delta$), and dI=$2\times(\frac{1}{4}-\delta)$=($\frac{1}{2}-2\delta$).

Therefore, GmI$\propto$($2-\pi/2$)+$\pi\times(\frac{1}{2}+2\delta)\propto(1-\pi\delta)$, and GmQ$\propto$($2-\pi/2$)+$\pi\times(\frac{1}{2}-2\delta)\propto(1+\pi\delta)$ are given. If loads of the amplitude adjustment unit 11 on the I side and the Q-side are equal to each other, a ratio of a voltage gain of the amplitude adjustment unit on the I side and the Q-side is the ratio of conversion gain of the voltage-to-current changing unit, which is represented by the following formula, $$\frac{GM_I}{GM_Q} \propto \frac{1-\pi\delta}{1+\pi\delta} \quad (2)$$

[Description on Effect]

As represented in the formulae (1) and (2), in the quadrature mixer of the embodiment, even if phase difference between LO_I and LO_Q deviates from 90 degrees by ($\delta \times 360$) degrees as shown in FIG. 2B, a ratio of amplitude between IQ generated in the frequency-conversion unit 10 is the inverse of a ratio of a gain between IQ in the amplitude adjustment unit.

In the quadrature mixer of the embodiment, if the frequency-conversion unit 10 connects with the amplitude adjustment unit 11 in series, an amplitude error generated in the frequency-conversion unit 10 can be automatically adjusted even when a duty ratio of a clock signal on the I side differs from that on the Q side due to deviation of phase difference of the clock signal.

The quadrature mixer of the embodiment does not need to preliminarily prepare a function of variability to adjust an element value, and does not need to integrate an error for long time in order to detect a generating error.

The quadrature mixer of the embodiment can always follow change of temperature, a power source voltage and the like, since a phase error of LO is timely adjusted in the amplitude adjustment unit. Therefore, it is not necessary to arrange other means for adjustment of a demodulated IQ signal, and the phase error and the amplitude error can be reduced. The quadrature mixer is available for usage in which a signal with a first intermediate frequency instead of the RF signal enters the quadrature mixer and a signal in the baseband or a signal with the second intermediate frequency is outputted.

The quadrature mixer is available for usage in which a signal in the baseband or a signal in an intermediate frequency band enters the quadrature mixer and the RF signal is outputted. Phase relations in LO_I, LO_Q, LO_IB and LO_QB, and CLKI, CLKQ, CLKIB and CLKQB may be optionally reversed in response to a desired signal frequency to be received and a range of a LO frequency.

Specific circuits of the frequency-conversion unit 10 and the amplitude adjustment unit 11 are described below.

Figure 5:
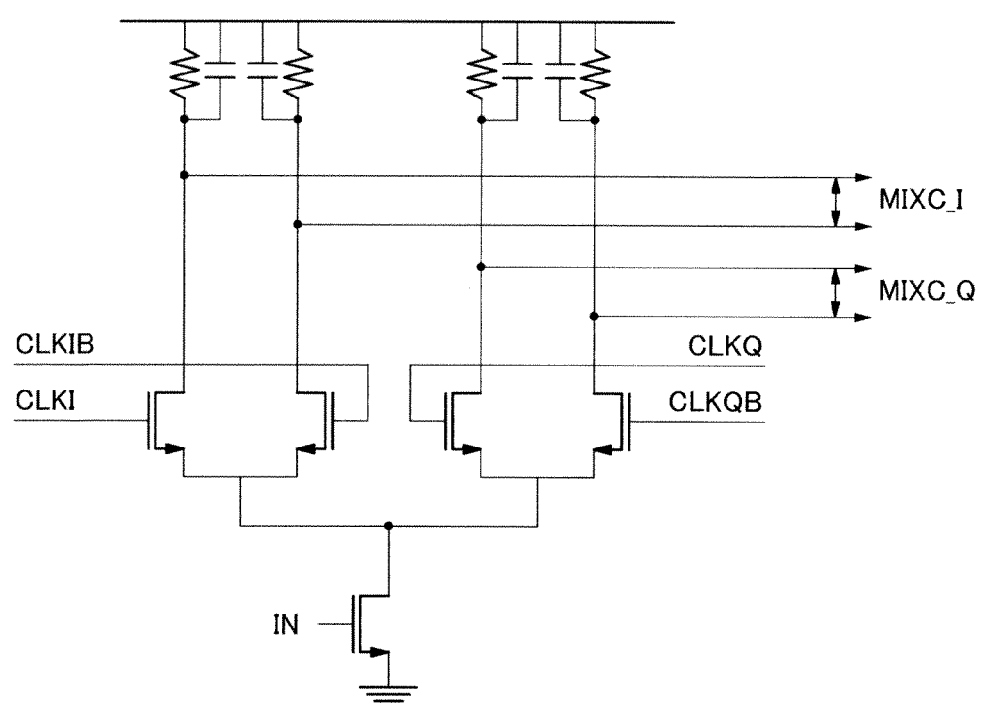
FIG. 5 is a diagram illustrating a specific circuit of the frequency-conversion unit used in the first embodiment of the invention.

FIG. 5 illustrates a specific circuit example of the frequency-conversion unit 10. In FIG. 5, a NMOS transistor (hereinafter, NMOS) which receives a receiving signal corresponds to the voltage-to-current changing circuit 31. Four NMOSs to switch paths where a current flows correspond to switching elements 32, 33, 34 and 35, respectively. Circuits in which a resistance and a capacitance are connected in parallel correspond to loads 35 and 37.

Figure 6A:
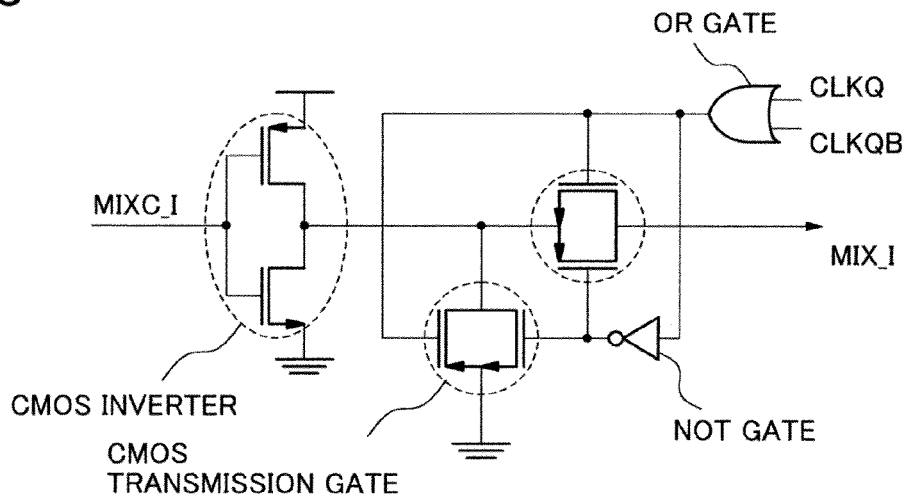
FIG. 6A is a diagram illustrating a voltage-to-current changing unit used in the amplitude adjustment unit in the first embodiment of the invention.
Figure 6A:
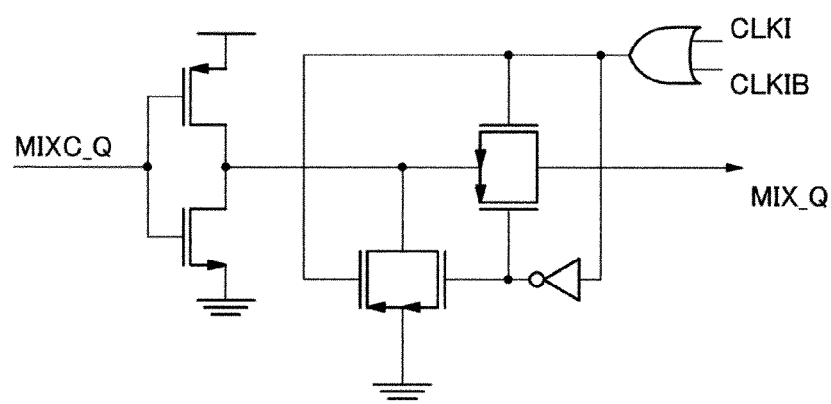

FIG. 6A illustrates a specific circuit example of the voltage-to-current changing units 42 and 44 with a conversion gain proportional to a duty ratio of the control signal which is used in the amplitude adjustment unit 11 of the embodiment. The voltage-to-current changing units 42 and 44 are basically configured by using a CMOS inverter and a CMOS transmission gate.

An operation of the voltage-to-current changing unit 44 is described below in detail, and the description is applicable to the voltage-to-current changing unit 44 as well.

In FIG. 6A, an OR gate in FIG. 4 and a NOT gate reversing the result thereof are shown. In the voltage-to-current changing unit 44 on the I side, the control clock signals CLKQ and CLKQB enter the OR gate, and the outputted voltage thereof enters the NMOS of the CMOS transmission gate and a gate terminal of a PMOS transistor (hereinafter, PMOS).

The CMOS transmission gate is used as a switching element. The CMOS transmission gate connects a path where a signal flows, which is changed into a current by the CMOS inverter while CLKQ is at a high level, to the output terminal side, and connects a path where a signal flows, which is changed into a current by the CMOS inverter while CLKQB is at a high level, to the fixed voltage side.

The NMOS of the CMOS transmission gate is at a conduction state when the gate terminal is at a high level, and the PMOS thereof is at a conduction state when the gate terminal is at a low level. An hourly-averaged conversion gain of the voltage-to-current changing unit of the embodiment is represented as a formula which is given by multiplying the voltage-to-current conversion gain of the CMOS inverter by a duty ratio of the CLKQ or the CLKQB.

The CMOS transmission gate intermittently extracts an output current of the CMOS inverter at a time interval defined by a logical sum between the CLKQ and CLKQB (output of OR gate) or a logical sum between the CLKI and CLKIB (output of OR gate).

The voltage-to-current changing unit 42 provides the conversion gain $\pi$ d, when the voltage-to-current conversion gain is $\pi$, and a duty ratio of the control signal is d.

Next, described is a method for acquiring the voltage-to-current changing unit 41 with the conversion gain of $(2-\pi/2)$ in the amplitude adjustment unit 11. The voltage-to-current changing unit 41 is most easily acquired by making the same circuit configuration as the CMOS inverter with the conversion gain of $\pi$, and multiplying a gate width of a MOSFET by $(2-\pi/2)/\pi$. If the control terminal is always given a high level, the voltage-to-current changing unit 41 with the effective conversion gain of $(2-\pi/2)$ is acquired.

Although the voltage-to-current conversion gain of the CMOS inverter is $\pi$ or $(2-\pi/2)$, the most important point in the embodiment is the ratio thereof. In the quadrature mixer of the embodiment, each conversion gain may be multiplied by an appropriate coefficient. Even if the voltage-to-current conversion gain of the CMOS inverter is k $\pi$ and k $(2-\pi/2)$ for any coefficient k, a function of the amplitude adjustment unit 11 is not lost.

In FIG. 6A, the CMOS transmission gate using the NMOS and the PMOS in a complementary manner is used as a switching element, any one of the NMOS and the PMOS may be employed. If one of the CMOS and the PMOS is selected as a switching element, either the CMOS or the PMOS is preferable, which can add a higher absolute value of a gate-to-source voltage of a transistor at a conduction state.

For example, when a DC voltage level on a communication path is 0.4V, a high level voltage of a logical gate is 1.0V, and a low level voltage thereof is 0V, the gate-to-source voltage of 0.6V is kept if the NMOS is employed. The gate-to-source voltage becomes 0.4V if the PMOS is employed. In this case, when the NMOS is employed as a switching element, it is possible to reduce on-resistance and bring it close to a more ideal switching element.

The example is the case that signal amplitude is small, and the gate-to-source voltage varies depending on the signal amplitude. If the NMOS and PMOS are employed in a complementary manner, advantages are acquired, in which signal amplitude dependency of the on-resistance is suppressed and it is possible to cancel a non-ideal factor, i.e. feed-through of a clock via gate capacitance or leakage of channel electric charge at the time of shifting from a conduction state to an open state.

Figure 6B:
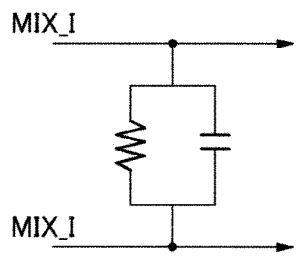
FIG. 6B is a diagram illustrating a load used in the amplitude adjustment unit in the first embodiment of the invention.
Figure 6B:
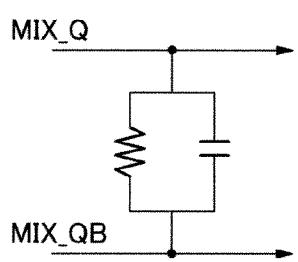

Next, a specific circuit example of a load in the amplitude adjustment unit 11 is shown in FIG. 6B. FIG. 6B illustrates a load including a resistance and a capacitance connected to each other in parallel and corresponds to the loads 45, 46 in FIG. 4. The loads 45, 46 configure a primary low-pass type filter together with the voltage-to-current changing units 41, 42 (43, 44). The loads 45, 46 are applicable to a high order, which is not less than second order, low-pass type filter, a high-pass type filter, a band-pass filter, and complex band-pass filter. The loads 45, 46 include a resistance and a capacitance between differential signal paths. However, the resistance and capacitance may be placed between a pair of fixed potential.

Next, a circuit, which is used in the embodiment, to acquire a clock waveform shown in FIGS. 2A, B is described.

Figure 7A:
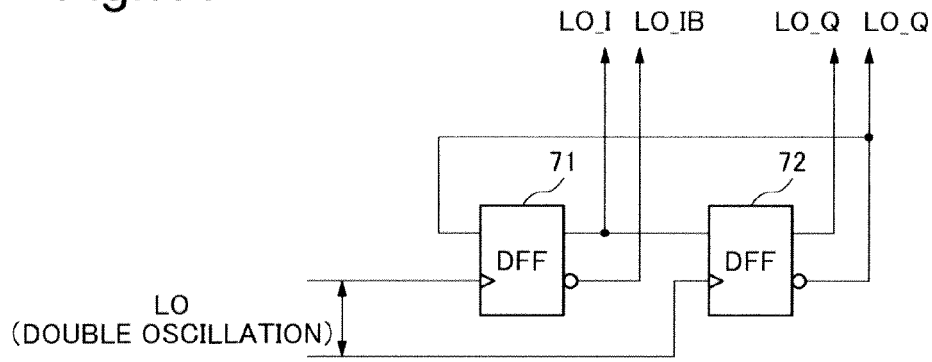
FIG. 7A is a diagram illustrating a circuit generating a clock signal required for an operation of the first embodiment of the invention.
Figure 7B:
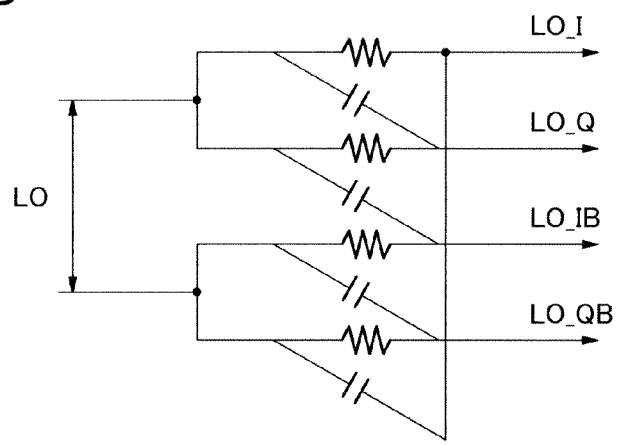
FIG. 7B is a diagram illustrating a circuit generating a clock signal required for an operation of the first embodiment of the invention.

An example of a circuit is shown in FIG. 7A and FIG. 7B, which generates signals LO_I, LO_Q, LO_IB and LO_QB each having a duty ratio of 50%, phases of which are different from each other by 90 degrees as shown in FIG. 2A.

FIG. 7A illustrates a circuit which generates LO_L LO_Q, LO_IB and LO_QB by dividing the LO signal oscillating at a doubled frequency by using D-type Flip Flops (DFF) 71, 72. FIG. 7B illustrates a circuit which generates the LO_I, LO_Q, LO_IB and LO_QB by utilizing phase rotation using polyphase philter.

Figure 7C:
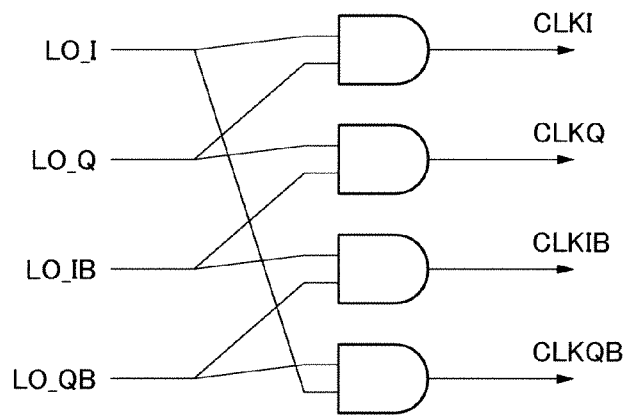
FIG. 7C is a diagram illustrating a circuit generating a clock signal required for an operation of the first embodiment of the invention.

Next, FIG. 7C illustrates an example of a circuit generating the clock signal CLKI, CLKQ, CLKIB and CLKQB each having a duty ratio of 25% from the LO_L LO_Q, LO_IB and LO_QB each having a duty ratio of 50%.

The circuit calculates the logical product between the LO_I and LO_Q to generate the CLKI. The circuit also calculates the logical product between the LO_Q and LO_IB to generate the CLKQ, calculates the logical product between the LO_IB and LO_QB to generate the CLKIB, and calculates the logical product between the LO_QB and LO_I to generate the CLKQB.

Examples of the specific circuits of the quadrature mixer of the embodiment are described above. When compared with a related mixer, elements which are newly added to the quadrature mixer are only the switching element and the logical gate in the amplitude adjustment 11.

That is because the voltage-to-current changing unit or the like in the amplitude adjustment unit 11 is a constituent part of an amplifier, a filter or the like which is connected to a rear position of an quadrature mixer in a common receiver, and is not a part which is essentially added in the quadrature mixer of the embodiment.

For example, the load composed of the resistance and capacitance shown in FIG. 6B is variable in gain if a value of the resistance thereof is varied, and is variable in bandwidth of a filter a value of the capacitance is varied.

That is, if a configuration of the load is changed, the load doubles as a roll of a functional block which is required for a common receiver. Since areas of the switching element of the amplitude adjustment unit and the logical gate thereof which are newly added are very small, all in all influence thereof can be almost ignored. A current consumed in the circuits is only a breakthrough current at the moment of change of the control signal, and can be extremely reduced by using a fine CMOS process. Further, an element switching a RF signal path is unnecessary and there is little loss of signal power. Therefore, the quadrature mixer, which can demodulate a received signal with high accuracy without calibrating the phase error of IQ and the amplitude error, can be provided.

[Second Embodiment]

Figure 8:
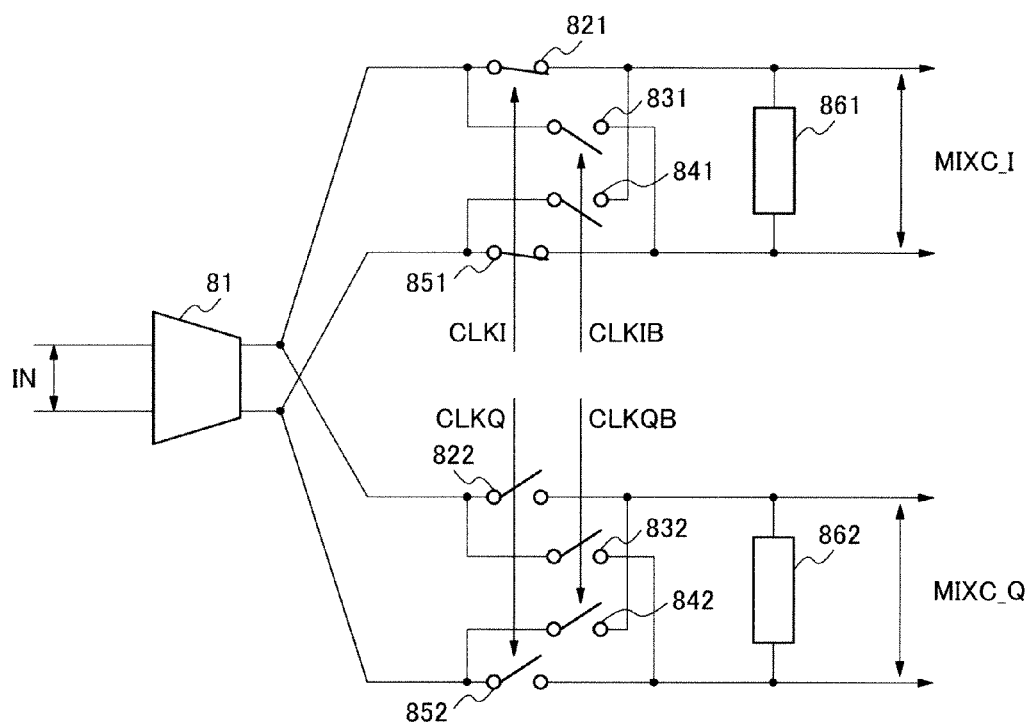
FIG. 8 is a diagram illustrating a frequency-conversion unit used in a second embodiment of the invention.

A second embodiment is described using FIG. 8. The difference is that the quadrature mixer of the embodiment includes the frequency-conversion unit 10 with a double-balance configuration in the first embodiment.

The quadrature mixer of the embodiment includes the double-balance configuration including a circuit composed of switching elements 821, 851, 831 and 841, and a load 861 at the rear position thereof in the frequency-conversion unit 12 on the I side, and a circuit composed of switching elements 822, 852, 832 and 842, and a load 862 at the rear position thereof in the frequency-conversion unit 13 on the Q side.

In the frequency-conversion unit 12 on the I side, the CLKI enters the switching elements 821 and 851, and the CLKIB enters the switching elements 831 and 841. Similarly, in the frequency-conversion unit 13 on the Q side, the CLKQ enters the switching elements 822 and 852, and the CLKQB enters the switching elements 832 and 842.

Figure 9:
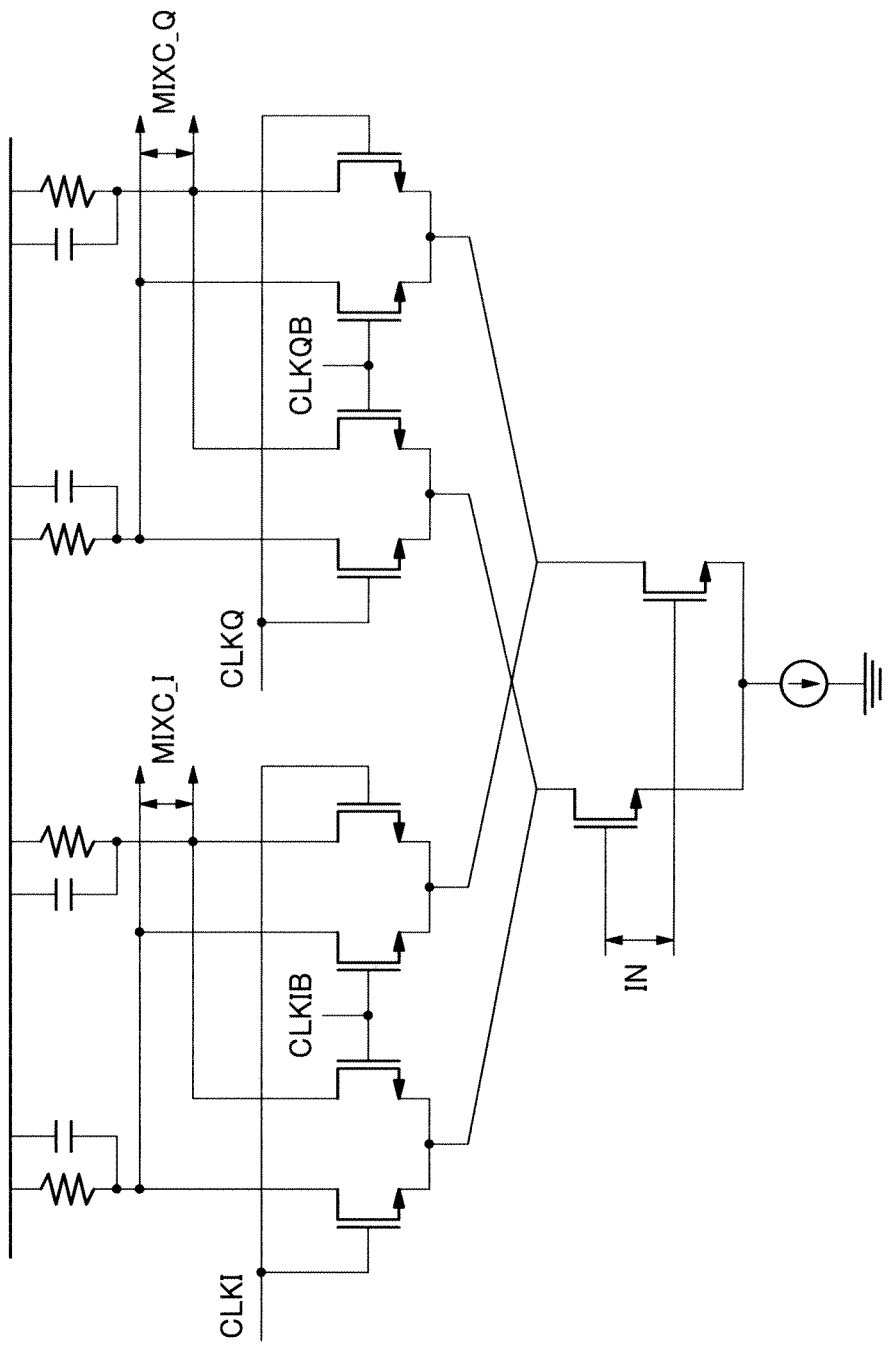
FIG. 9 is a diagram illustrating a specific circuit of the frequency-conversion unit used in the second embodiment of the invention.

Being able to receive a signal differentially from the frequency-conversion unit 10 and a clock signal by employing the double-balance configuration, the quadrature mixer of the embodiment includes an effect to suppress even-ordered distortion and feed through of a signal, like RF, LO. FIG. 9 illustrates an example of a specific circuit of the frequency-conversion unit 10 of the embodiment.

[Third Embodiment]

Figure 10:
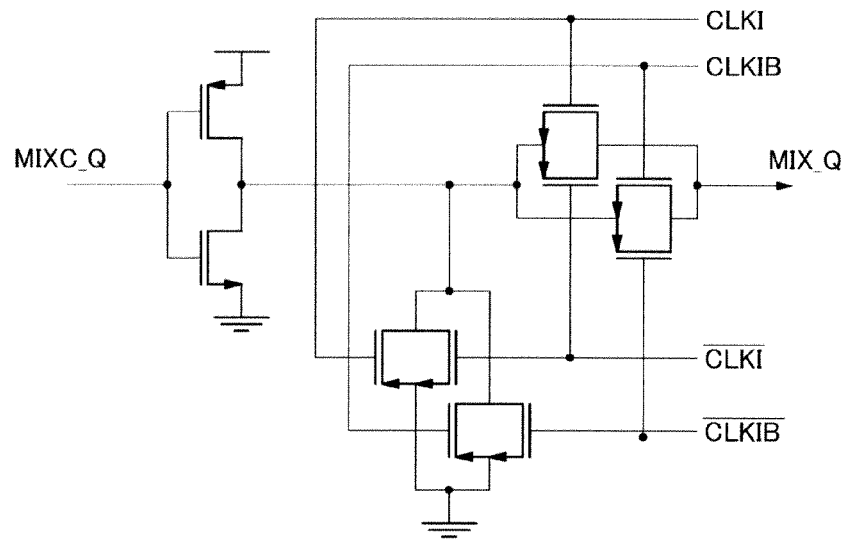
FIG. 10 is a diagram illustrating a voltage-to-current changing unit used in an amplitude adjustment unit in a third embodiment of the invention.

A third embodiment is described using FIG. 10. The difference is that the amplitude adjustment unit 11 of the embodiment conducts the OR operation with the CMOS transmission gates arranged in parallel, without the OR gate, compared with the first embodiment shown in FIG. 6A.

The embodiment can prevent the duty ratio of the control clock signal from collapsing due to variation of performance of transistors configuring the OR gate, by including the above configuration. Since the circuit shown in FIG. 10 is a specific example of the voltage-to-current changing unit 44 on the Q side, the circuit employs the CLKI and CLKIB as the control signal. In the voltage-to-current changing unit 42 on the I side, the CLKQ and CLKQB are employed as the control signal.

[Fourth Embodiment]

Figure 11:
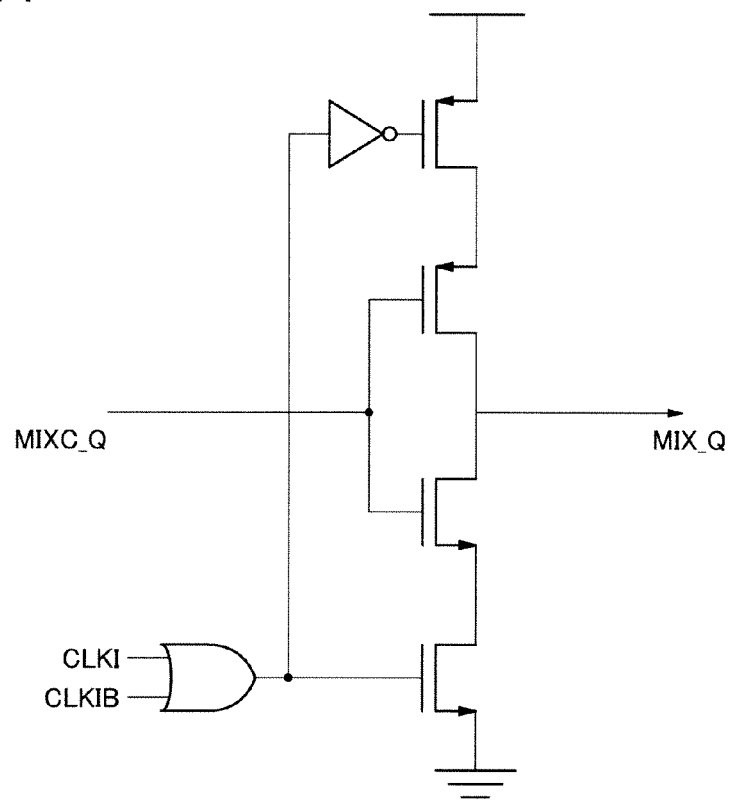
FIG. 11 is a diagram illustrating a voltage-to-current changing unit used in an amplitude adjustment unit in a fourth embodiment of the invention.

A fourth embodiment is described using FIG. 11. In the amplitude adjustment unit 12 of the embodiment, compared with the first embodiment, the PMOS and NMOS connect to the CMOS inverter on the power terminal side and on the earth terminal side, respectively, instead of arranging the CMOS transmission gate on the output signal path.

A gate terminal of the PMOS is connected to the CLKI or the CLKIB. A gate terminal of the NMOS is connected to the CLKI or the CLKIB. A circuit shown in FIG. 11, which is specific example of the voltage-to-current changing unit 44 on the Q side, employs the CLKI and CLKIB as the control signal. In the voltage-to-current changing unit 42 on the I side, the CLKQ to and CLKQB as the control signal.

[Fifth Embodiment]

Figure 12:
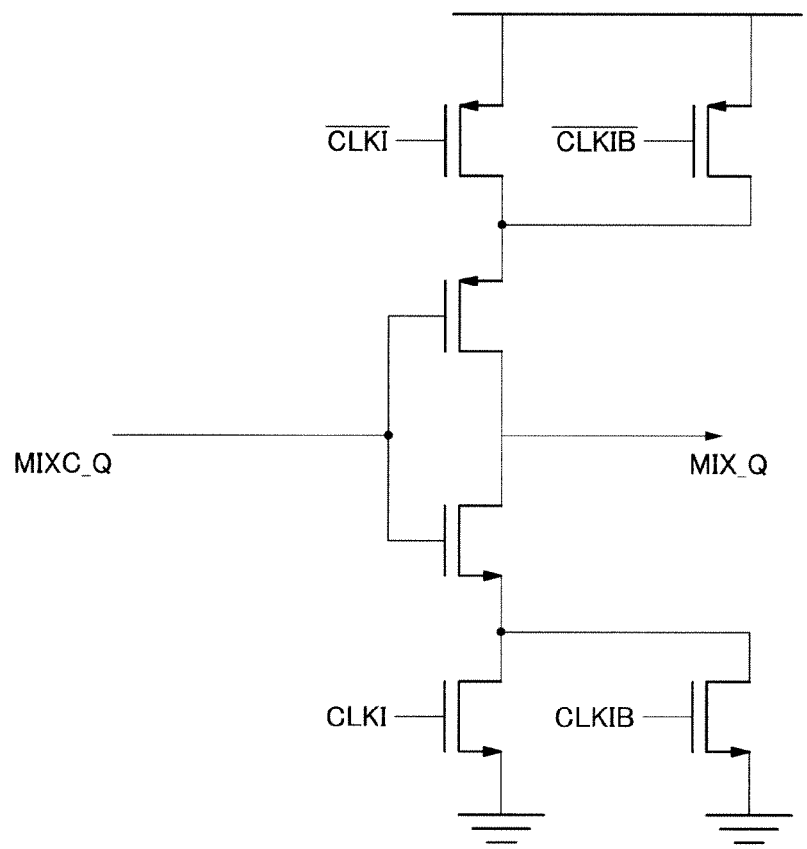
FIG. 12 is a diagram illustrating a voltage-to-current changing unit used in an amplitude adjustment unit in a fifth embodiment of the invention.

A fifth embodiment is described using FIG. 12. The difference is that the amplitude adjustment unit 12 of the embodiment conducts the OR operation with the PMOS and NMOS arranged in parallel without using the OR gate, compared with the fourth embodiment.

The embodiment can prevent the duty ratio of the control clock signal from collapsing due to variation of performance of transistors forming the OR gate, by including the above configuration. Since the circuit shown in FIG. 12 is a specific example of the voltage-to-current changing unit 44 on the Q side, the CLKI and CLKIB are employed as the control signal. In the voltage-to-current changing unit 42 on the I side, the CLKQ and CLKQB are employed as the control signal.

[Sixth Embodiment]

Figure 13:
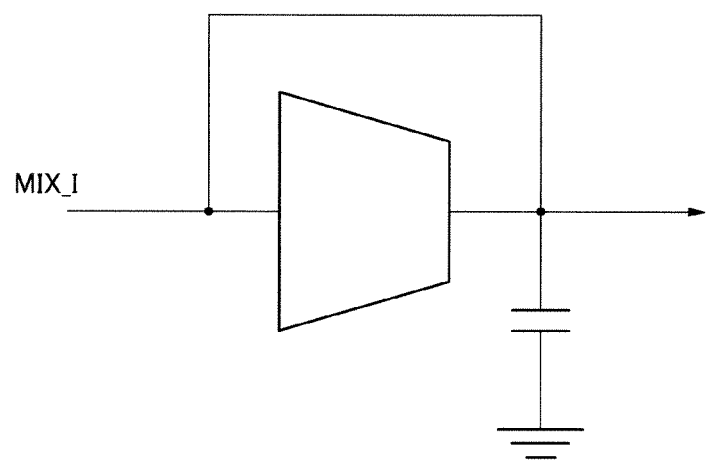
FIG. 13 is a diagram illustrating a load used in an amplitude adjustment unit in a sixth embodiment of the invention.

A sixth embodiment is described using FIG. 13. The difference is that the load of the embodiment employs the voltage-to-current changing unit, input and output terminals of which are short-circuited, instead of a resistance, compared with the load 45 of the amplitude adjustment unit 12 of the first embodiment shown in FIG. 4. The primary low-pass type filter is configured together with the voltage-to-current changing units 41 and 42 at the front position of the amplitude adjustment unit 12.

An advantage is obtained, wherein gain of a pass band of the primary low-pass type filter is defined by a ratio of conversion gain of the voltage-to-current changing unit by configuring the voltage-to current changing units 41 and 42 at the front position in the amplitude adjustment unit 12 and the voltage-to-current changing unit as the load by using the same circuit. Since a ratio of voltage-to-current conversion gain is not sensitive to relative variation, a circuit having resistance to variation generated in a manufacturing process is obtained.

[Seventh Embodiment]

Figure 14:
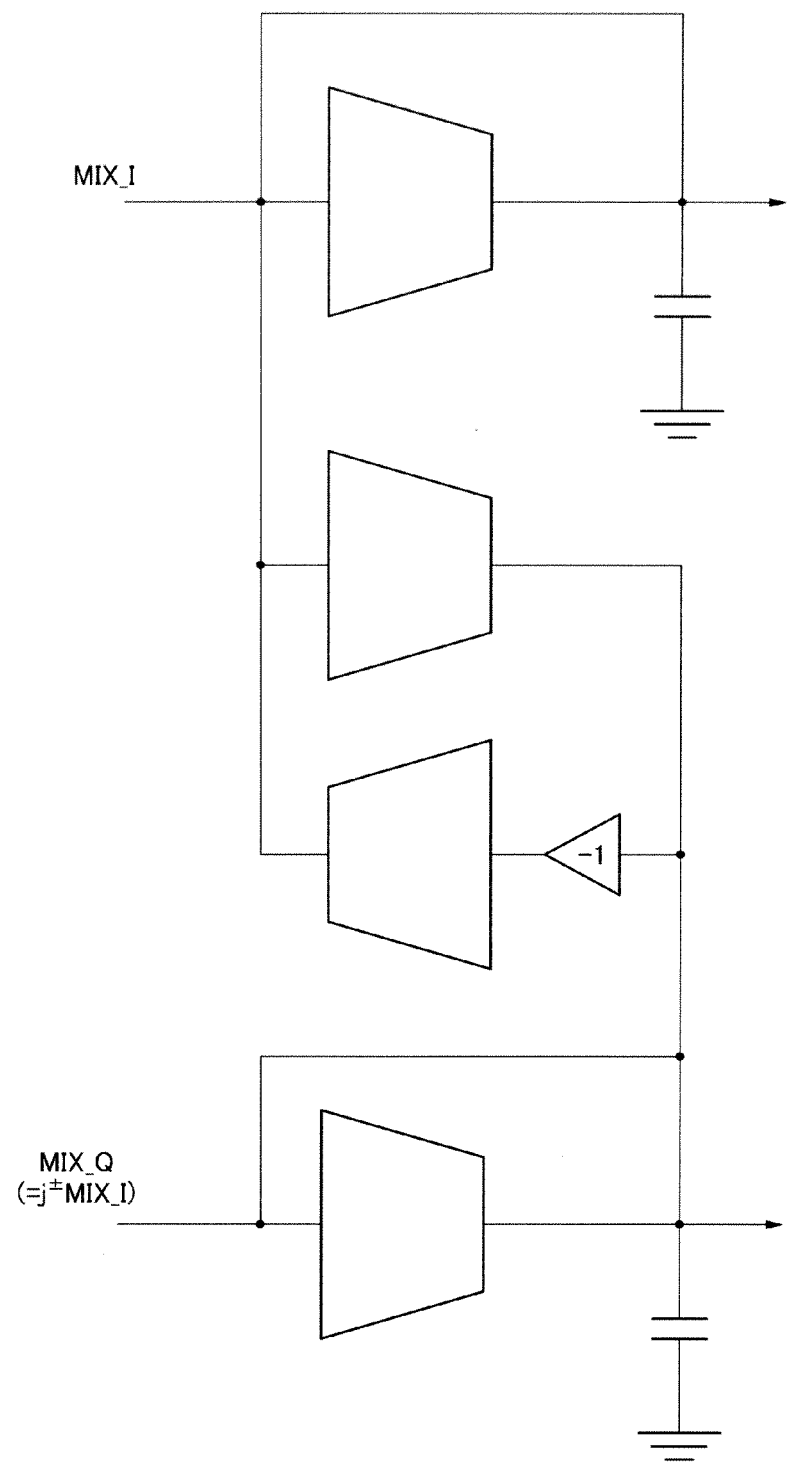
FIG. 14 is a diagram illustrating a load used in an amplitude adjustment unit in a seventh embodiment of the invention.

A seventh embodiment is described using FIG. 14. In a load of the embodiment, the load in the sixth embodiment is used as a load on the I path and a load on the Q path. The difference is that the voltage-to-current changing units are connected to each other between the I path and the Q path in a cross-coupled manner to configure the primary complex band-pass filter. Thereby, the effect to suppress an image interference wave is acquired.

Since the phase of the outputs the MIXC_I and MIXC_Q of the frequency-conversion unit 10 is 90 degrees even if the phase of outputs the LO_I and LO_Q deviates from 90 degrees, and deviation of amplitude of the MIXC_I and MIXC_Q is adjusted with the voltage-to-current changing units 41 and 42 at a input position of the amplitude adjustment unit 11, an ideal IQ signal enters the complex band-pass filter in the embodiment. Therefore, a high image removal ratio is obtained without adjusting a circuit parameter.

[Eighth Embodiment]

Figure 15:
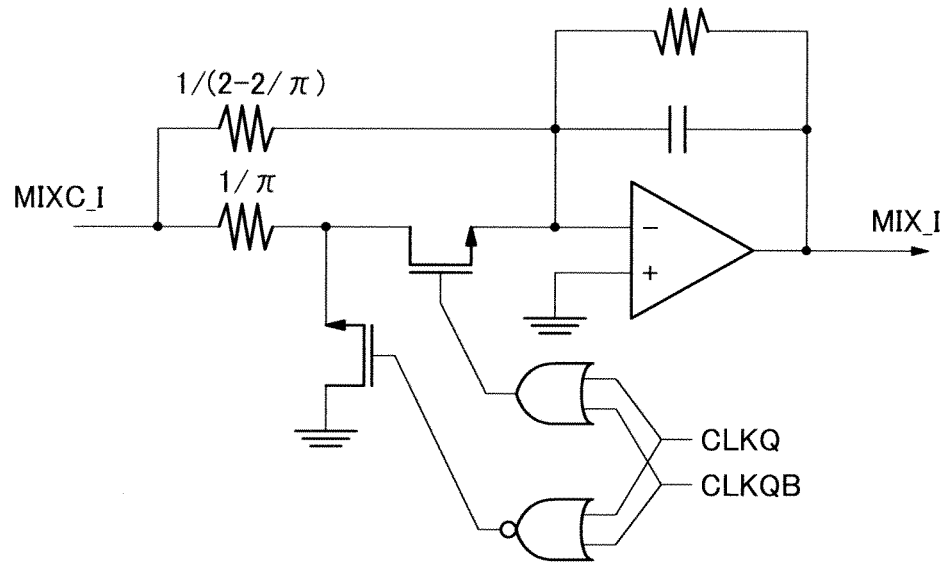
FIG. 15 is a diagram illustrating a voltage-to-current changing unit used in an amplitude adjustment unit in an eighth embodiment of the invention.
Figure 15:
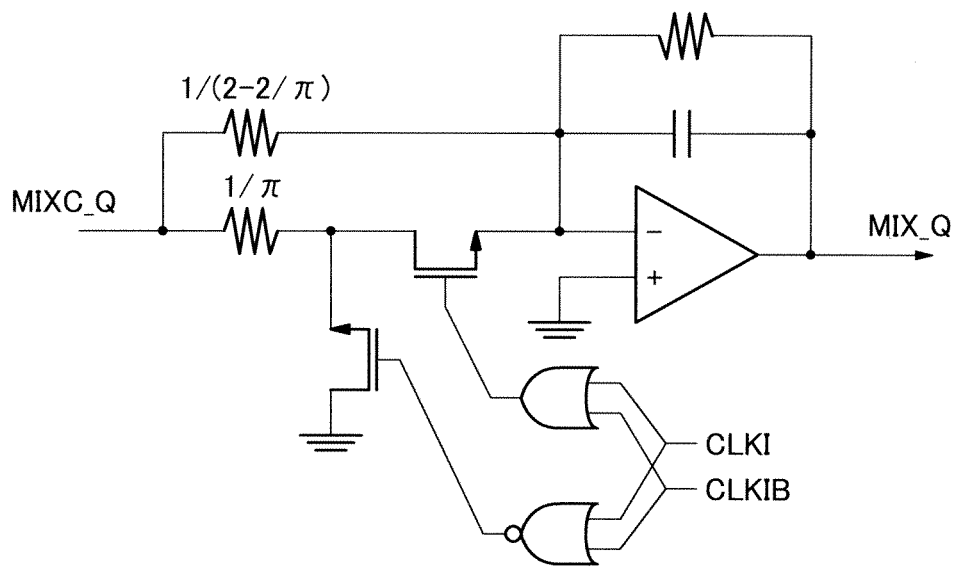

An eighth embodiment is described using FIG. 15. The difference is that the amplitude adjustment unit 11 of the embodiment employs a resistance, a terminal on the one side of which is connected to a virtual grounding point of an operation amplifier instead of the voltage-to-current changing unit, compared with the first embodiment. In the embodiment, since a source voltage of the NMOS configuring the switching element remains constant, it is possible to suppress distortion due to input signal level dependency of an on resistance of the NMOS. Further, since charge-discharge of electric charge is not carried out with respect to a parasitic capacitance on a MOSFET or wiring which is connected to the virtual grounding point, an effect that there is no influence of the parasitic capacitance is obtained.

In the embodiment, by using the operational amplifier in which feedback through a resistance element and a capacitance element, as a load, is arranged, the primary low-pass type filter is formed, furthermore, that is applicable to a high order not less than second order low-pass type filter, a high-pass type filter, a band-pass filter, and a complex band-pass filter.

Though the NMOS is used as the switching element in FIG. 15, the PMOS may be employed. In this case, the PMOS becomes a conduction state when the gate voltage is at a low level. If one of the CMOS and the PMOS is selected as the switching element, either the CMOS or the PMOS is preferable, which can add a higher absolute value of gate-to-source voltage of a transistor at a conduction state. The NMOS and PMOS may be used in a complementary manner. Even if the resistance element of the embodiment is replaced into the voltage-to-current changing unit described in the first embodiment and an output terminal of the voltage-to-current changing unit is connected to the virtual grounding point of the operational amplifier, the same effect is obtained.

[Ninth Embodiment]

Figure 16:
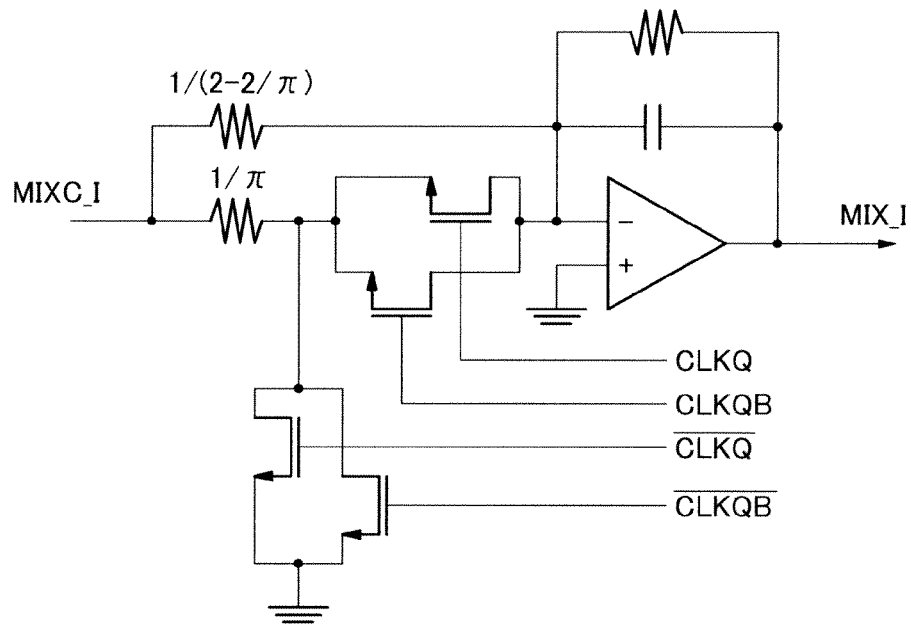
FIG. 16 is a diagram illustrating a voltage-to-current changing unit used in an amplitude adjustment unit in a ninth embodiment of the invention.
Figure 16:
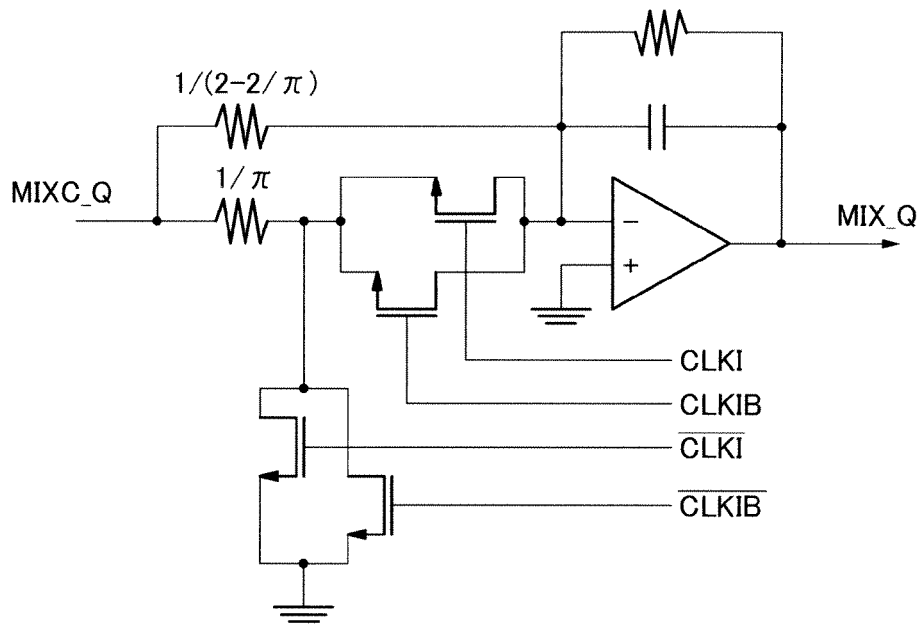

A ninth embodiment is described using FIG. 16. The difference is that the amplitude adjustment unit 11 conducts an OR operation by arranging the NMOS used as the switching element in parallel, compared with the eighth embodiment. The embodiment with above configuration can prevent the duty ratio of the control clock signal from collapsing due to variation of performance of transistors forming the OR gate.

[Tenth Embodiment]

Figure 17A:
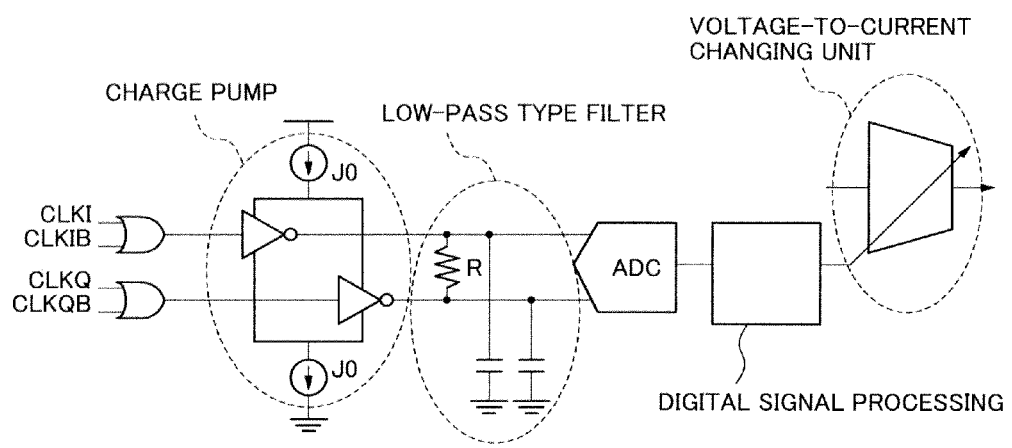
FIG. 17A is a diagram illustrating a voltage-to-current changing unit used in an amplitude adjustment unit in a tenth embodiment of the invention.

A tenth embodiment is described using FIG. 17A. The difference is that the voltage-to-current changing unit configuring the amplitude adjustment unit 11 of the embodiment generates a DC control voltage proportional to the duty ratio of the control signal with a charge pump and a low-pass type filter at the rear position thereof, and controls voltage-to-current conversion gain using the control voltage, compared with the first embodiment.

In the charge pump in FIG. 17A, depending on a duty ratio of (CLKI OR CLKIB) and (CLKQ OR CLKQB), voltage difference between differential inputs of an analog-digital converter is generated. For example, when a duty ratio of (CLKI OR CLKIB) is (½+2 δ), and a duty ratio of (CLKQ OR CLKQB) is (½−2 δ), a current of 2 δ×J0 flows and voltage difference of 2 δ×J0R occurs in a resistance R, as a load, between the differential on time average, if a bias current of the charge pump is J0.

Figure 17B:
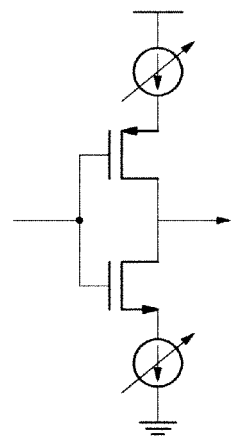
FIG. 17B is a diagram illustrating a specific circuit of a voltage-to-current changing unit used in the amplitude adjustment unit in the tenth embodiment of the invention.

The capacitance connected to the output side of the charge pump plays a roll of the low-pass type filter for smoothing a signal wave. At this time, if J0 and R are known, deviation δ from the duty ratio of 25% can be determined. Therefore, when a digital signal processing unit calculates δ, and a bias current of the voltage-to current changing unit is selected depending on the value, the voltage-to current changing unit proportional to a duty ratio of the control clock signal is obtained. FIG. 17B illustrates a circuit example of the voltage-to current changing unit which can control conversion gain with a bias current.

Figure 17C:
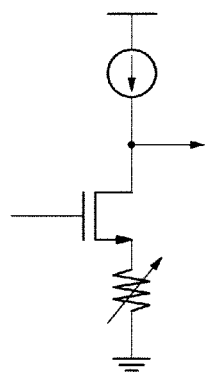
FIG. 17C is a diagram illustrating a specific circuit of a voltage-to-current changing unit used in the amplitude adjustment unit in the tenth embodiment of the invention.

The embodiment shows a system in which the conversion gain of the voltage-to-current changing unit is controlled by selecting the bias current by digital data by using the analog-digital converter, furthermore, a system in which a DC voltage is generated again with the analog-digital converter using the digital data, the conversion gain is controlled by adjusting the bias current depending on the voltage, and a system in which the bias current is directly controlled by using the DC voltage acquired with the charge pump and the low-pass type filter, are possible. Further it is possible to make the conversion gain of the voltage-to-current changing unit variable by controlling a resistance value. The method for controlling the resistance value includes a method for selecting a different resistance value using the digital data, and a method for adjusting and utilizing the on resistance by controlling a gate voltage of a MOS transistor. FIG. 17C illustrates a circuit example of the voltage-to current changing unit which can control the conversion gain by controlling the resistance value.

[Eleventh Embodiment]

Figure 18:
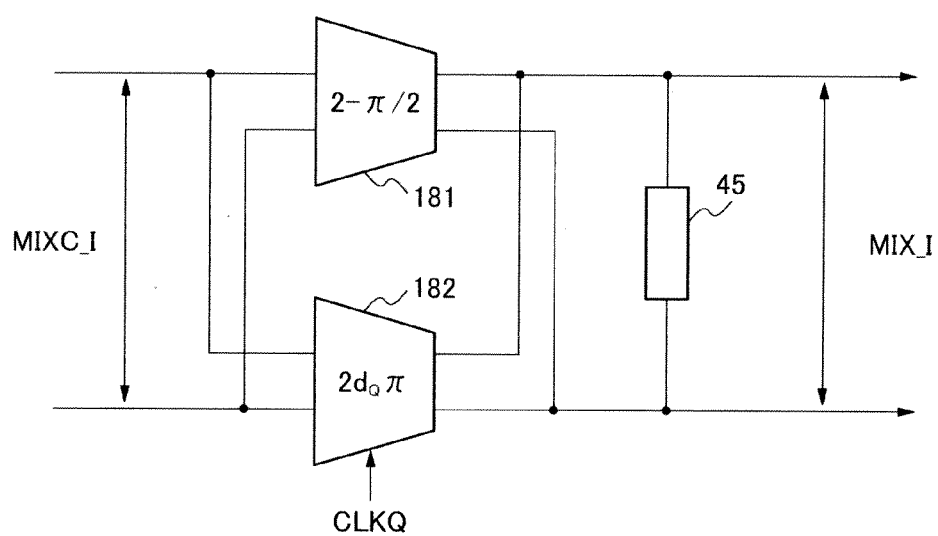
FIG. 18 is a diagram illustrating a specific circuit of a voltage-to-current changing unit used in an amplitude adjustment unit in an eleventh embodiment of the invention.
Figure 18:
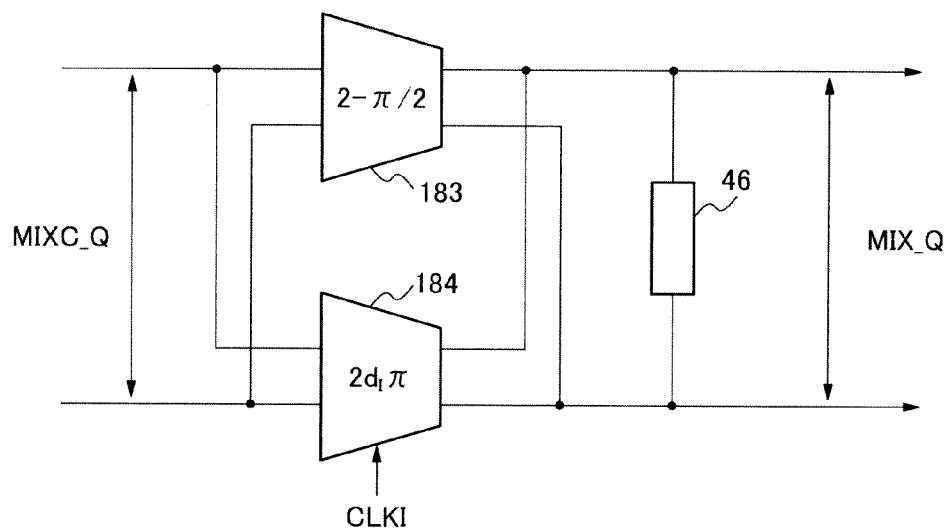

An eleventh embodiment is described using FIG. 18. In the embodiment, a voltage-to-current changing unit 182 of the I-side amplitude adjustment unit 14 controls the conversion gain with only the clock signal CLKI, compared with the first embodiment. A voltage-to-current changing unit 184 of the Q-side amplitude adjustment unit 15 also controls the conversion gain with only the clock signal CLKQ.

Since duty ratios of CLKI and CLKQ are dI=¼+δ, and dQ=¼−δ, respectively, the duty ratio of the control clock is ½, compared with the first embodiment. Since a frequency of the control clock is ½ in the embodiment, compared with the first embodiment, a consumption current in a circuit performing a high speed on-off operation, like a clock buffer, can be suppressed. The conversion gain of the voltage-to-current changing units 182 and 184 are 2dI π and 2dQ π, respectively, in order to satisfy the formula (2).

For example, when the voltage-to-current changing unit configured with the CMOS inverter and switching element, like the first embodiment, voltage-to-current conversion gain of the CMOS inverter has to be doubled. Combination of the control clocks in the embodiment may be not only the combination of the CLKI and CLKQ, but also the CLKIB and CLKQB, the CLKIB and CLKQ, or the CLKI and CLKQB.

Figure 19:
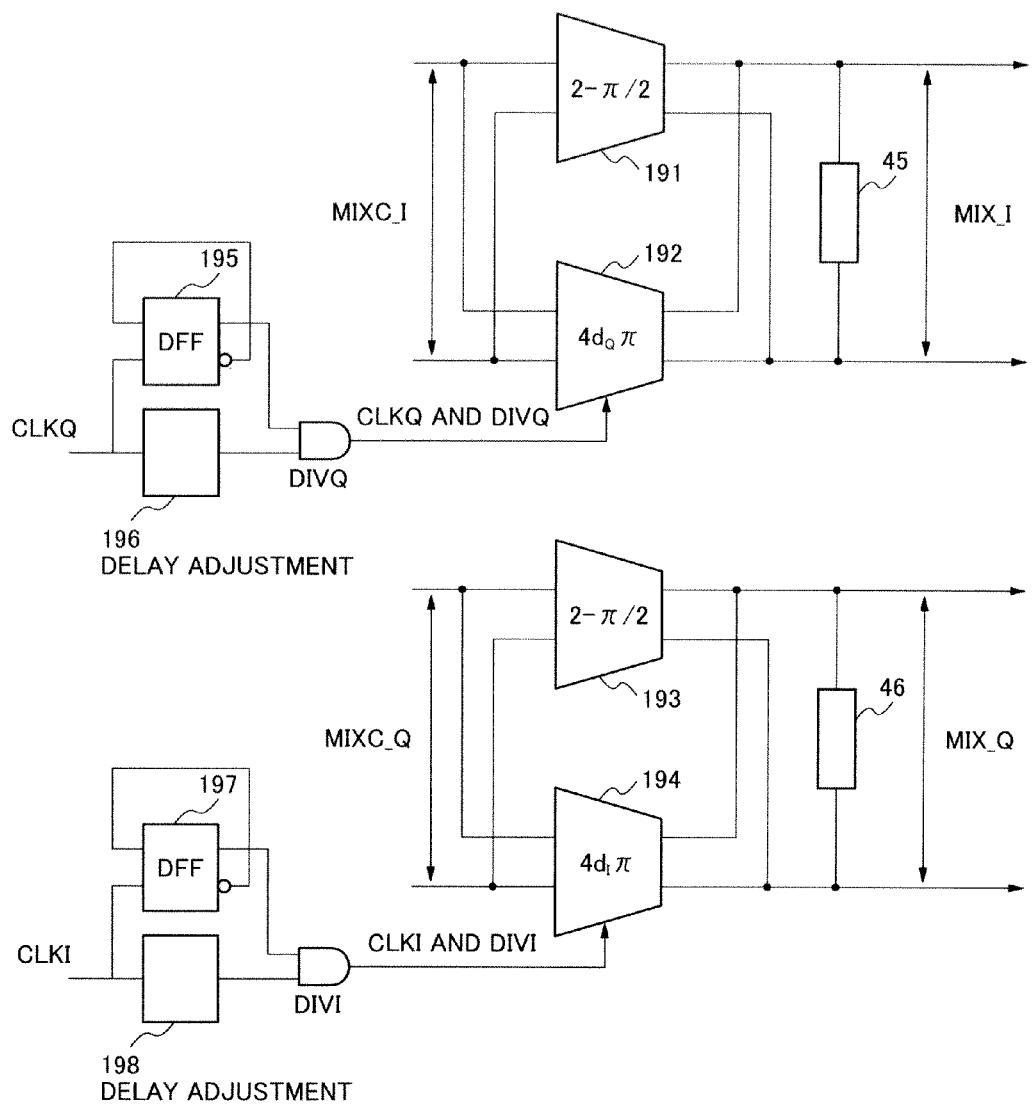
FIG. 19 is a diagram illustrating a specific circuit of the voltage-to-current changing unit used in the amplitude adjustment unit in an eleventh embodiment of the invention.
Figure 20:
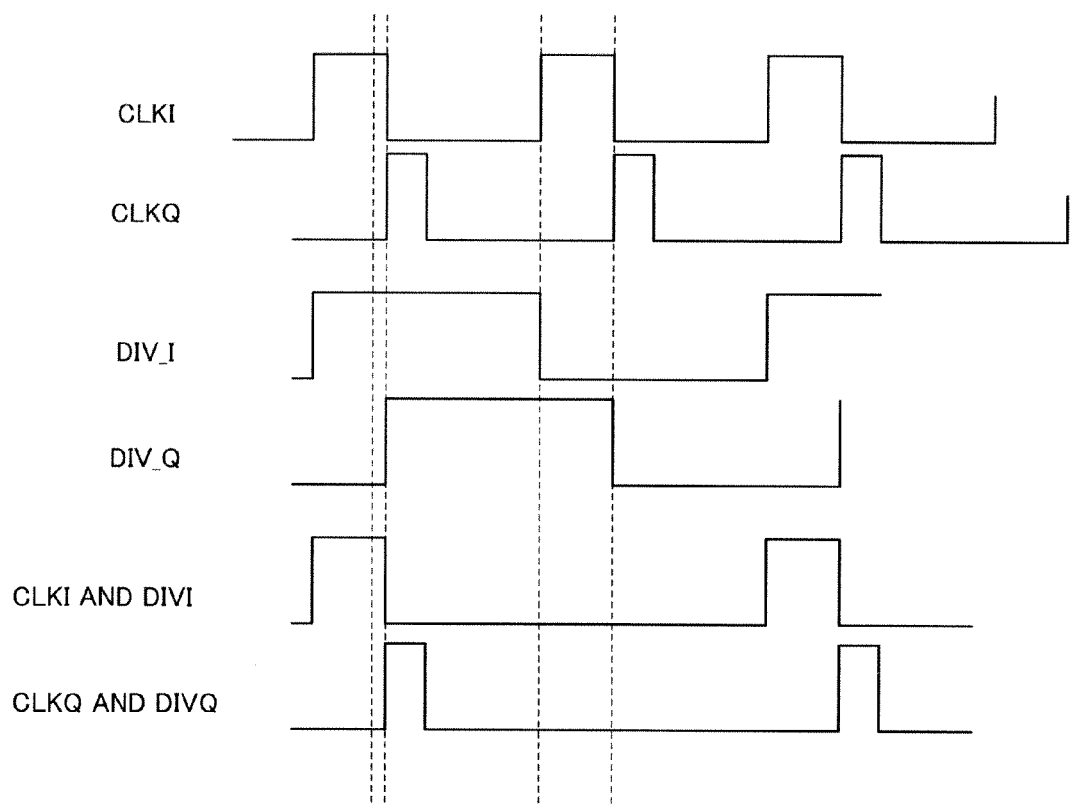
FIG. 20 is a diagram illustrating timing of a clock signal required for an operation of the eleventh embodiment of the invention.
Figure 21:
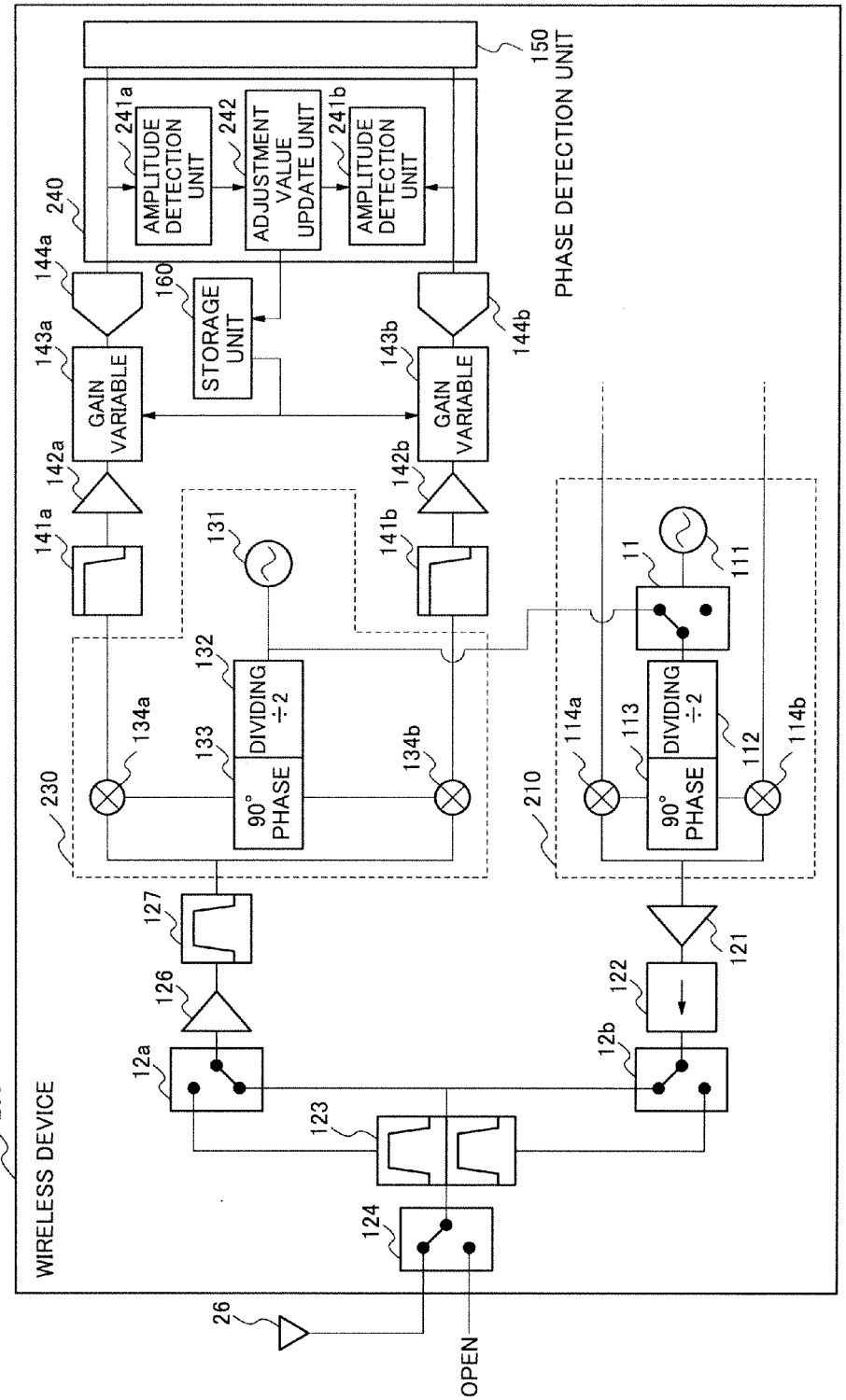
FIG. 21 is a diagram illustrating a configuration of a wireless circuit adjusting amplitude of an I signal and a Q signal described in Patent document 2.

As shown in FIG. 19, by figuring out a logical product of a clock DIVI and a clock DIVQ to which the CLKI and CLKQ are divided, respectively, and the CLKI and CLKQ themselves, a clock (CLKI AND DIVI), (CLKQ AND DIVQ) each having a clock period of ½ may be the control clock signal while keeping a width of on time. FIG. 20 shows a timing chart of each clock. Thereby a consumption current of a circuit, like a clock buffer, can be further reduced. Since the duty ratios of (CLKI AND DIVI), (CLKQ AND DIVQ) are dI=(¼+δ)/2, dQ=(¼−δ)/2, respectively, the duty ratio of the control clock becomes ¼, compared with the first embodiment. Conversion gain of voltage-to-current changing units 192 and 194 are 4dI π and 4dQ π, respectively, in order to satisfy the formula (2). FIG. 19 illustrates circuits 196 and 198 delaying clocks by the same time as DFFs 195 and 197 used for dividing clocks. In FIG. 19 and FIG. 20, CLKI and CLKQ are divided, further it is much the same for CLKIB and CLKQB. In FIG. 19 and FIG. 20, divide-by-2 dividing is shown, but a divide-by value is not limited to 2.

While having described an invention of the present application referring to the embodiments, the invention of the present application is not limited to the above mentioned embodiments. It is to be understood that to the configurations and details of the invention of the present application, various changes can be made within the scope of the invention of the present application by those skilled in the art.

This application claims priority from Japanese Patent Application No. 2009-159377 filed on Jul. 4, 2009, the contents of which are incorporation herein by reference in their entirety.

Explanation of Reference Numeral
10 frequency-conversion unit
11 amplitude adjustment unit
12 I-side frequency-conversion unit
13 Q-side frequency-conversion unit
14 I-side amplitude adjustment unit
15 Q-side amplitude adjustment unit
31, 41, 42, 43, 44, 181, 182, 183, 184 voltage-to-current changing unit
32, 33, 34, 35, 821, 831, 841, 851, 822, 832, 842, 852 switching element
36, 37, 45, 46, 861, 862 load
71, 72, 195, 197 DFF

The invention claimed is:

1. An quadrature mixer, comprising:
   a first frequency-conversion unit that outputs a sixth signal derived by multiplying a first signal by a second and a fourth signals;
   a second frequency-conversion unit that outputs a seventh signal derived by multiplying the first signal by a third and a fifth signals;
   a first amplitude adjustment unit that outputs a eighth signal derived by multiplying the sixth signal by the third and fifth signals and
   a second amplitude adjustment unit that outputs a ninth signal derived by multiplying the seventh signal by the second and fifth signals.

2. The quadrature mixer of claim 1, wherein
with respect to the second, third, fourth and fifth signals, when the second signal falls, the third signal rises, when the third signal falls, the fourth signal rises, when the fourth signal falls, the fifth signal rises, and when the fifth signal falls, the second signal rises.

3. The quadrature mixer of claim 2, wherein
time difference between a central value of time when the second signal remains at a high level and a central value of time when the third signal remains at a high level corresponds to a quarter of a period,
   time difference between a central value of time when the third signal remains at a high level and a central value of time when the fourth signal remains at a high level corresponds to a quarter of a period,
   time difference between a central value of time when the fourth signal remains at a high level and a central value of time when the fifth signal remains at a high level corresponds to a quarter of a period, and
   time difference between a central value of time when the fifth signal remains at a high level and a central value of time when the second signal remains at a high level corresponds to a quarter of a period.

4. The quadrature mixer of claim 3, wherein
a gain of the first frequency-conversion unit depends on duty ratios of the second and fourth signals,
   a gain of the second frequency-conversion unit depends on duty ratios of the third and fifth signals,
   a gain of the first amplitude adjustment unit depends on duty ratios of the third and fifth signals,
   a gain of the second amplitude adjustment unit depends on duty ratios of the second and fourth signals.

5. The quadrature mixer of claim 4, wherein
a ratio between the gains of the first and second frequency-conversion units has an inverse relationship to a ratio between the gains of the 1 d second amplitude adjustment units.

6. The quadrature mixer of claim 5, wherein
the first amplitude adjustment unit comprises a first voltage-to-current changing element with a fixed conversion gain and a second voltage-to-current changing element with a conversion in proportional to the duty ratios of the third and fifth signals;
   the second amplitude adjustment unit comprises a third voltage-to-current changing element with a fixed conversion gain and a fourth voltage-to-current changing element with a conversion gain proportional to the duty ratios of the second and fourth signals.

7. The quadrature mixer of claim 6, wherein
the second voltage-to-current changing element comprises a fifth voltage-to-current changing element with a fixed conversion gain; and
a first switching element that intermittently extracts a current outputted from the fifth voltage-to-current changing element at a time interval proportional to the duty ratios of the third and fifth signals,
   the fourth voltage-to-current changing element comprises a sixth voltage-to-current changing element with a fixed conversion gain; and
a second switching element that intermittently extracts a current outputted from the sixth voltage-to-current changing element at a time interval proportional to the duty ratios of the second and fourth signals.

8. The quadrature mixer of claim 7, wherein
the first switching element is connected in series with a path of the current outputted from the fifth voltage-to-current changing element, and
the second switching element is connected in series with a path of he current outputted from the sixth voltage-to-current changing element.

9. The quadrature mixer of claim 7, wherein
the first switching element is connected in series with a path of a voltage or a current that is supplied to the fifth voltage-to-current changing element, and
the second switching element is connected in series with a path of a voltage or a current that is supplied to the sixth voltage-to-current changing element.

10. The quadrature mixer of claim 7, wherein
a ratio between the gains of the first and third voltage-to-current changing elements and the gains of the fifth and sixth voltage-to-current changing elements is $(1-\pi/2):\pi$, where $\pi$ is the circular constant.

11. The quadrature mixer of claim 6, further comprising:
aloud at a rear position of the amplitude adjustment unit, wherein
the load comprises a voltage-to-current changing unit whose an input and an output terminals are short-circuited and forms a primary low-pass type filter together with a voltage-to-current changing unit at a front position of the amplitude adjustment unit, and
the voltage-to-current changing unit at the front position of the amplitude adjustment unit and the voltage-to-current changing unit of the load are configured using the same circuit.

12. The quadrature mixer of claim 11, wherein
the load forms a primary complex band-pass filter by connecting with the voltage-to-current changing unit between an I path and a Q path in a cross-coupled manner.

13. The quadrature mixer of claim 1, wherein
the frequency-conversion unit includes a double-balance configuration.

14. The quadrature mixer of claim 1, wherein
the amplitude adjustment unit carries out an OR operation with a CMOS transmission gate arranged in parallel.

15. The quadrature mixer of claim 1, wherein
a PMOS and a NMOS are connected to a power terminal side and a grounding terminal side of a CMOS inverter as switching elements, respectively, in the amplitude adjustment unit.

16. The quadrature mixer of claim 1, wherein
the amplitude adjustment unit carries out an OR operation with a PMOS and a NMOS arranged in parallel.

17. The quadrature mixer of claim 1, wherein
the amplitude adjustment unit employs a resistance element, one terminal of which is connected with a virtual grounding point of an operational amplifier, instead of the voltage-to-current changing unit.

18. The quadrature mixer of claim 1, wherein
the amplitude adjustment unit carries out an OR operation by arranging a NMOS used as a switching element in parallel.

19. The quadrature mixer of claim 1, wherein
the voltage-to-current changing unit generates a DC control voltage proportional to a duty ratio of a control signal with a charge pump and a low-pass type filter, and controls a voltage-to-current conversion gain based on the control voltage.

20. A frequency-conversion method, comprising,
outputting a sixth signal derived by multiplying a first signal by a second and a fourth signals, and outputting a seventh signal derived by multiplying the first signal by a third and a fifth signals; and
adjusting an amplitude of the sixth signal by a block including an element having a gain proportional to duty ratios of the third and fifth signals, and adjusting an amplitude of the seventh signal by a block including an element having a gain proportional to duty ratios of the second and fourth signals.

* * * * *